(12) United States Patent
Kojima et al.

(10) Patent No.: US 12,051,613 B2
(45) Date of Patent: Jul. 30, 2024

(54) METHOD OF USING A PROCESSING APPARATUS

(71) Applicant: DISCO CORPORATION, Tokyo (JP)

(72) Inventors: Yoshimasa Kojima, Tokyo (JP); Jun Nakama, Tokyo (JP); Satoshi Hanajima, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 791 days.

(21) Appl. No.: 17/140,595

(22) Filed: Jan. 4, 2021

(65) Prior Publication Data

US 2021/0210375 A1 Jul. 8, 2021

(30) Foreign Application Priority Data

Jan. 6, 2020 (JP) ................................ 2020-000538

(51) Int. Cl.
*H01L 21/687* (2006.01)
*B23K 26/08* (2014.01)
*H01L 21/67* (2006.01)

(52) U.S. Cl.
CPC .. *H01L 21/68764* (2013.01); *H01L 21/67259* (2013.01); *B23K 26/0823* (2013.01); *B23K 26/0853* (2013.01)

(58) Field of Classification Search
CPC ............. H01L 21/67259; H01L 21/681; H01L 21/68764
See application file for complete search history.

(56) References Cited

U.S. PATENT DOCUMENTS

2002/0053586 A1   5/2002  Nishina et al.
2019/0287836 A1*  9/2019  Miyata ..................... G06T 7/75
2019/0317471 A1* 10/2019  Kashiwagi ........... G05B 19/402

FOREIGN PATENT DOCUMENTS

JP    2005223270 A  *  8/2005
JP    2010087141 A     4/2010
JP    2017199777 A    11/2017

OTHER PUBLICATIONS

Office Action issued in counterpart German patent application No. 10 2020 216 417.7, dated Dec. 8, 2022.
Search report issued in counterpart Singapore patent application No. 10202012565V, dated Jan. 14, 2022.

* cited by examiner

*Primary Examiner* — Raj R Gupta
(74) *Attorney, Agent, or Firm* — GREER BURNS & CRAIN, LTD.

(57) ABSTRACT

A method of using a processing apparatus that includes a holding unit with a rotatable chuck table for holding a workpiece; a processing unit for processing the workpiece; a camera for imaging the workpiece that is movable in an indexing feed direction; and a control unit for controlling the components. The method includes forming a linear processed mark in the workpiece, and then moving the chuck table to an imaging zone, where the camera images the processed mark. The method further includes calculating correction values or a correction angle, and carrying out processing feed of the chuck table in the imaging zone under a condition in which the camera has been corrected in position in the Y-axis direction based on the correction values or the chuck table has been rotated by the correction angle.

6 Claims, 14 Drawing Sheets

METHOD OF USING A PROCESSING APPARATUS

BACKGROUND OF THE INVENTION

Field of the Invention

The present invention relates to a processing apparatus.

Description of the Related Art

There are known processing apparatuses for processing a workpiece such as a device wafer along streets. The device wafer is formed from silicon, sapphire, gallium arsenide, silicon carbide (SiC) or the like, and carries a plurality of devices formed in regions defined by the streets (see, for example, JP 2017-199777 A). The processing apparatuses of this type include cutting apparatuses, each of which cuts a workpiece along streets by a cutting blade mounted on a spindle, and laser processing apparatuses, each of which focuses a laser beam to streets on a workpiece to form laser-processed grooves along the streets in the workpiece or to form modified layers along the streets inside the workpiece.

With each processing apparatus described above, a workpiece is held on a chuck table, and is processed while it is moved along guide rails in a processing feed direction (an X-axis direction). If the streets of the workpiece are directed parallel to the X-axis direction beforehand by rotating the chuck table, processing is possible along each street by moving the chuck table in the X-axis direction.

SUMMARY OF THE INVENTION

In the above-described processing apparatus, the chuck table is moved by a linear actuator that includes a holding unit (moving base) movable along guide rails. However, linear travel accuracy of the linear actuator is guaranteed for only a specified travel range (hereinafter called "the guaranteed range") that excludes its opposite ends. In a vicinity of the opposite ends of the guide rails, the linear travel accuracy is therefore low compared with that in the guaranteed range, so that the chuck table may slightly rotate as viewed in plan (as viewed from a camera) or may be fed for processing in the rotated state. If the workpiece is subjected to an alignment (its processing position is determined) or to a kerf check (its cut position is measured or adjusted for any positional deviation) in a region of any one of the opposite ends, processing may be performed at a wrong position, thereby possibly leading to a reduction in processing accuracy. If the guaranteed range is widened to the opposite ends or the linear actuator is increased in length to widen the guaranteed range, however, the linear actuator requires a higher cost and/or a larger installation space.

The present invention therefore has as an object thereof the provision of a processing apparatus that can suppress a reduction in processing accuracy while suppressing an increase in cost.

In accordance with a first aspect of the present invention, there is provided a processing apparatus including a holding unit having a rotatable chuck table configured to hold a workpiece, a processing unit configured to process the workpiece held on the chuck table, a processing feed unit that carries out processing feed of the holding unit in an X-axis direction, an indexing feed unit that carries out indexing feed of the processing unit in a Y-axis direction, a camera that images the workpiece held on the chuck table and is movable in an indexing feed direction, and a control unit configured to control the holding unit, the processing unit, the processing feed unit, the indexing feed unit, and the camera. The processing feed unit includes guide rails, and is configured to move the holding unit along the guide rails between a processing zone, in which the workpiece is processed by the processing unit, and an imaging zone, in which the workpiece is imaged by the camera at a position that is apart from the processing zone by a predetermined distance in the X-axis direction. The control unit includes a correction amount calculation section configured such that, after forming a linear processed mark in the workpiece by the processing unit while carrying out processing feed of the chuck table, the chuck table is moved to the imaging zone, the processed mark is imaged by the camera, and correction values in the Y-axis direction or a correction angle for the chuck table are or is then calculated from Y-coordinates of two points that are apart from each other in a processing feed direction on the processed mark, whereby when carrying out processing feed of the chuck table in the imaging zone, the camera is corrected in position in the Y-axis direction based on the correction values or the chuck table is rotated by the correction angle.

In the processing apparatus according to the first aspect of the present invention, the chuck table may preferably have a transparent member that forms a holding surface configured to hold the workpiece thereon, the camera may preferably have, at positions which are up and down with the transparent member interposed therebetween, a first camera in a vicinity of the processing unit and a second camera that is more distant than the first camera from the processing unit, and the control unit may preferably further include a coordinate storage section configured to store in terms of X and Y-coordinates a positional deviation between the first camera positioned to image a predetermined region on the workpiece held on the chuck table and the second camera positioned to image the predetermined region, and may preferably be configured to correct the position of the second camera based on the X and Y-coordinates stored in the coordinate storage section such that the second camera can image the predetermined region imaged by the first camera.

In the processing apparatus according to the first aspect of the present invention, the processing apparatus may preferably further include a display unit that displays a first image captured by the first camera and a second image captured by the second camera. The control unit may preferably further include an image control section configured to display the first image and the second image in superposition or juxtaposition on the display unit with one of the first image and the second image being inverted in the processing feed direction.

In accordance with a second aspect of the present invention, there is provided a processing apparatus including a holding unit having a rotatable chuck table configured to hold a workpiece, a processing unit configured to process the workpiece held on the chuck table, a processing feed unit that carries out processing feed of the holding unit in an X-axis direction, an indexing feed unit that carries out indexing feed of the processing unit in a Y-axis direction, a camera that images the workpiece held on the chuck table and is movable in the Y-axis direction, and a control unit configured to control the holding unit, the processing unit, the processing feed unit, the indexing feed unit, and the camera. The processing feed unit includes guide rails, and is configured to move the holding unit along the guide rails between a processing zone, in which the workpiece is processed by the processing unit, and an imaging zone, in which the workpiece is imaged by the camera at a position that is apart from the processing zone by a predetermined distance. The camera has a first camera in a vicinity of the processing unit, and a second camera that is more distant than the first camera from the processing unit. The control unit includes a correction amount calculation section configured to image a linear mark in the workpiece or the chuck table by the first camera, to rotate the chuck table to adjust the mark to a direction parallel to the X-axis direction, to move the chuck table to the imaging zone to image the mark by the second camera, and then to calculate correction values in the Y-axis direction or a correction angle for the chuck table from X and Y-coordinates of two points that are apart from each other in the X-axis direction on the mark, whereby when carrying out processing feed of the chuck table in the imaging zone and carrying out imaging, the second camera is subjected to indexing feed based on the correction values or the chuck table is rotated by the correction angle.

In the processing apparatus according to the second aspect of the present invention, the chuck table may preferably have a transparent member that forms a holding surface configured to hold the workpiece thereon, the camera may preferably have the first camera and the second camera at positions which are up and down with the transparent member interposed therebetween, and the control unit may preferably further include a coordinate storage section configured to store in terms of X and Y-coordinates a positional deviation between the first camera positioned to image a predetermined region on the workpiece held on the chuck table and the second camera positioned to image the predetermined region, and is configured to correct the position of the second camera based on the X and Y-coordinates stored in the coordinate storage section such that the second camera can image the predetermined region imaged by the first camera.

In the processing apparatus according to the second aspect of the present invention, the processing apparatus may preferably further include a display unit that displays a first image captured by the first camera and a second image captured by the second camera, and the control unit may preferably further include an image control section configured to display the first image and the second image in superposition or juxtaposition on the display unit with one of the first image and the second image being inverted in the X-axis direction.

The present invention brings about an advantageous effect that a reduction in processing accuracy can be suppressed while suppressing an increase in cost.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

With reference to the attached drawings, a description will be made in detail regarding embodiments of the present invention. However, the present invention shall not be limited by details that will be described in the embodiments. Elements of configurations that will hereinafter be described include those readily conceivable to persons skilled in the art and substantially the same ones. Further, the configurations that will hereinafter be described can be combined appropriately. Furthermore, various omissions, replacements, and modifications of configurations can be made within the scope not departing from the spirit of the present invention.

First Embodiment

Figure 1:
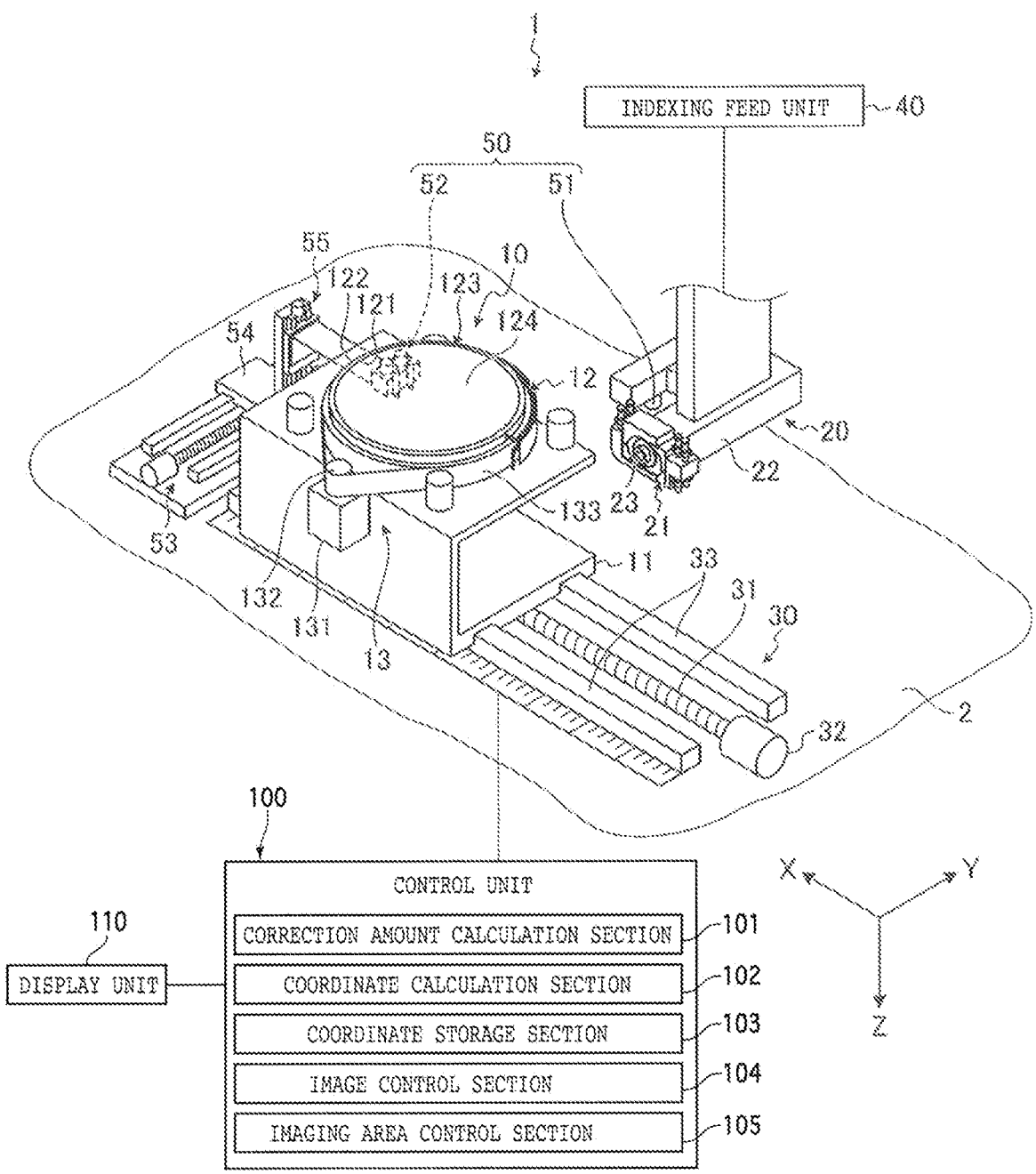
FIG. 1 is a perspective view depicting part of a processing apparatus according to a first embodiment.
Figure 2:
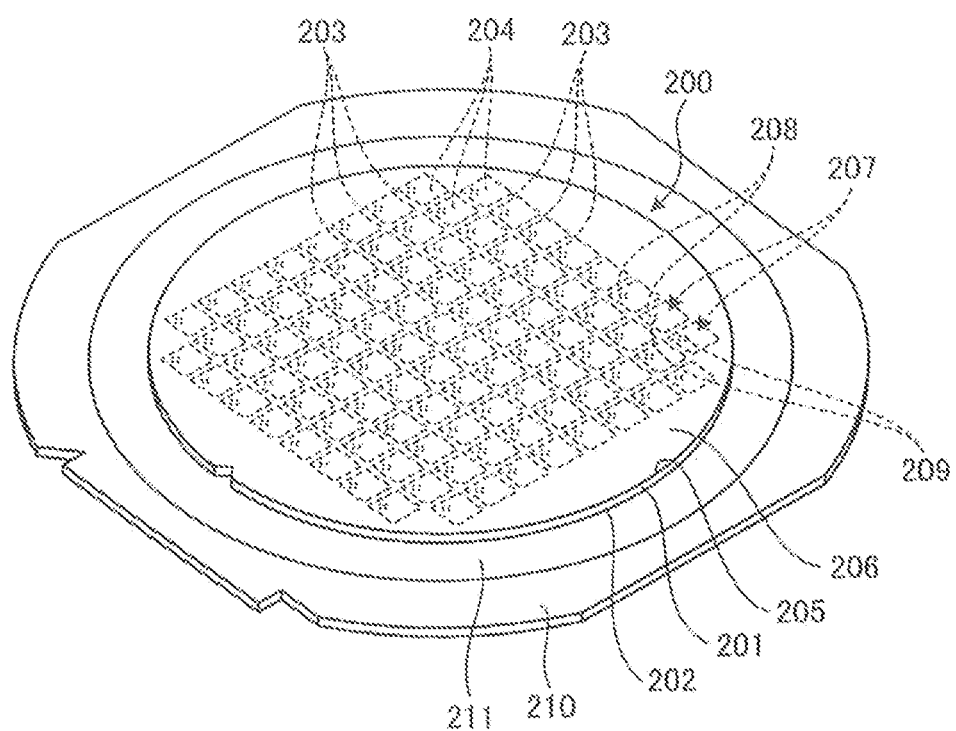
FIG. 2 is a perspective view of a workpiece as an object to be processed by the processing apparatus depicted in FIG. 1.
Figure 3:
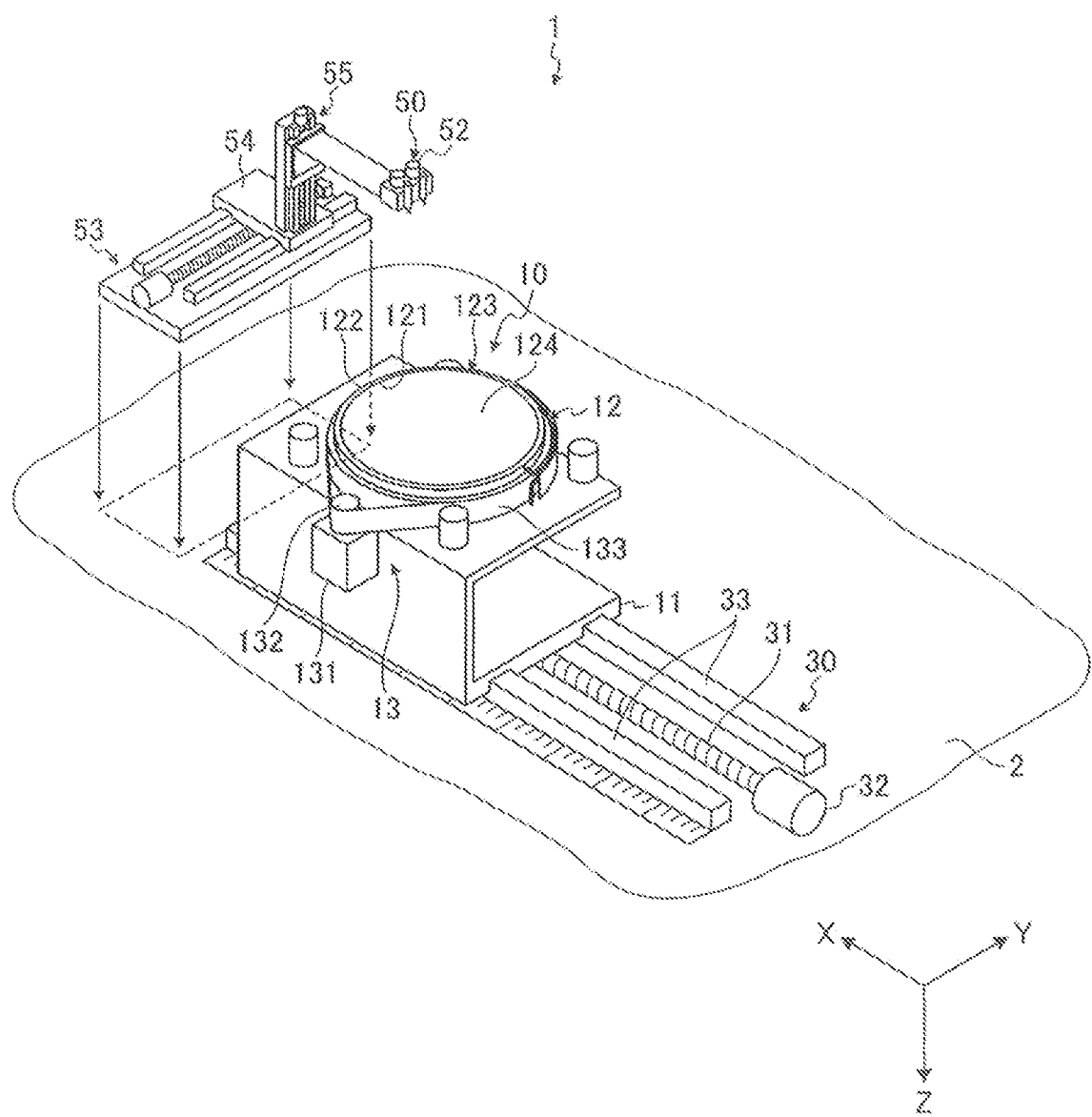
FIG. 3 is a perspective view depicting a holding unit and a second camera in the processing apparatus depicted in FIG. 1.
Figure 4:
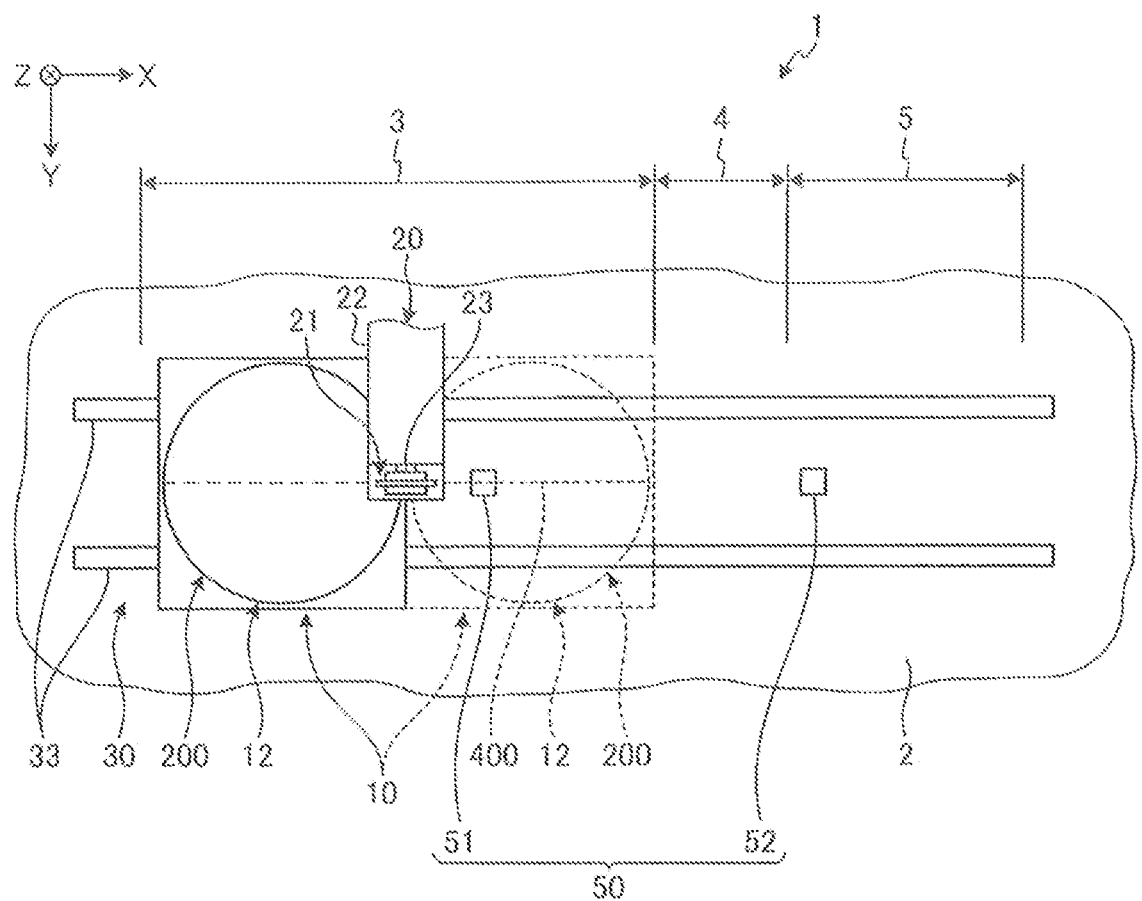
FIG. 4 is a plan view schematically illustrating a processing zone and an imaging zone in the processing apparatus depicted in FIG. 1.
Figure 5:
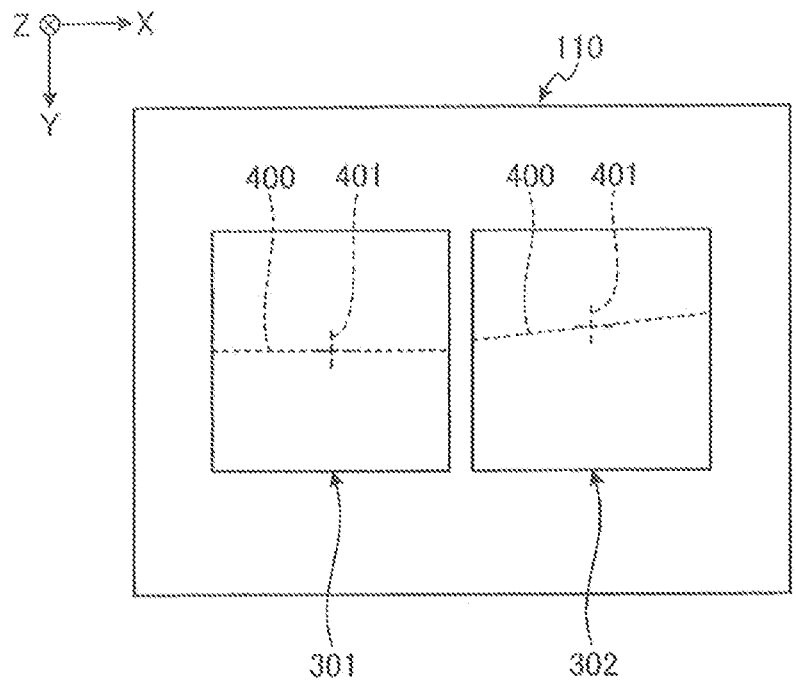
FIG. 5 is a view illustrating examples of a first image and a second image, which a display unit of the processing apparatus depicted in FIG. 1 displays.
Figure 6:
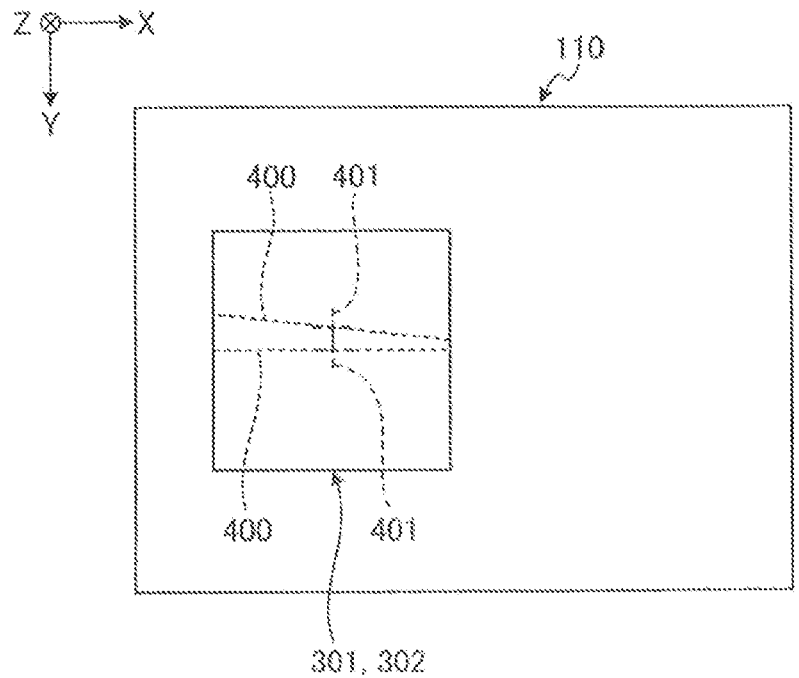
FIG. 6 is a view illustrating other examples of the first image and the second image, which the display unit of the processing apparatus depicted in FIG. 1 displays.
Figure 7:
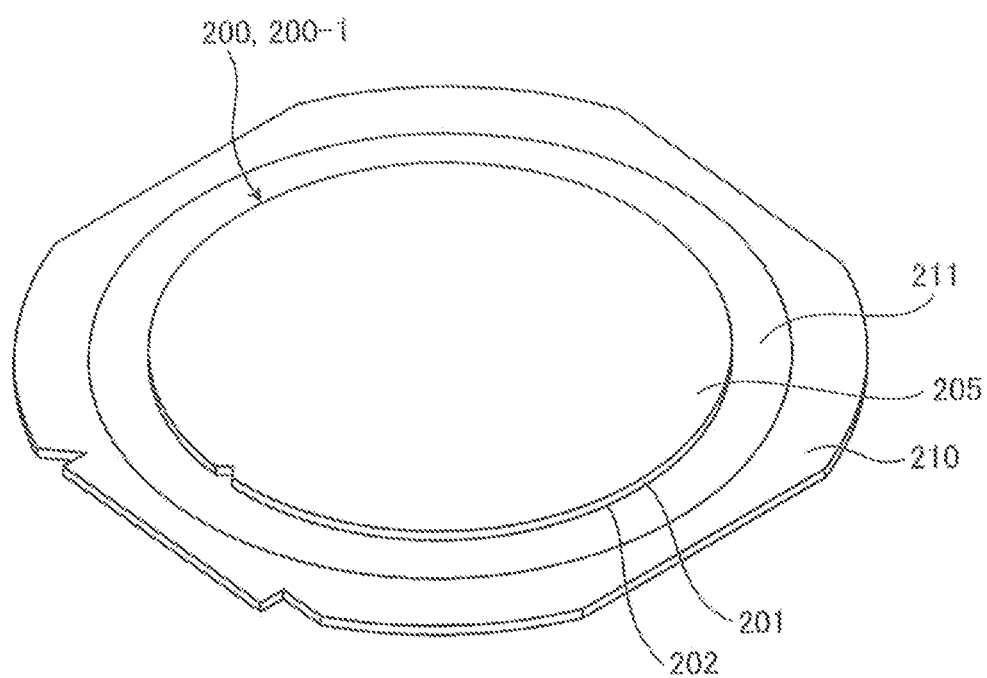
FIG. 7 is a perspective view of the workpiece on which a cut groove is to be formed when a correction amount calculation section of the processing apparatus depicted in FIG. 1 calculates a correction amount.

A processing apparatus according to a first embodiment of the present invention will be described based on the attached drawings, specifically FIGS. 1 through 17. Reference will first be made to FIGS. 1 to 7. FIG. 1 is a perspective view depicting part of the processing apparatus according to the first embodiment. FIG. 2 is a perspective view of a workpiece as an object to be processed by the processing apparatus depicted in FIG. 1. FIG. 3 is a perspective view depicting a holding unit and a second camera in the processing apparatus depicted in FIG. 1. FIG. 4 is a plan view schematically illustrating a processing zone and an imaging zone in the processing apparatus depicted in FIG. 1. FIG. 5 is a view illustrating examples of a first image and a second image, which a display unit of the processing apparatus depicted in FIG. 1 displays. FIG. 6 is a view illustrating other examples of the first image and the second image, which the display unit of the processing apparatus depicted in FIG. 1 displays. FIG. 7 is a perspective view of the workpiece on which a cut groove is to be formed when a correction amount calculation section of the processing apparatus depicted in FIG. 1 calculates a correction amount.

The processing apparatus 1 according to the first embodiment is used to cut (equivalent to "process") a workpiece 200 depicted in FIG. 2. The workpiece 200, as an object to be processed by the processing apparatus 1 depicted in FIG. 1, is a wafer such as a disk-shaped semiconductor wafer or optical device wafer, which includes a substrate 201 formed with silicon, sapphire, gallium arsenide, silicon carbide (SiC), or the like. In the workpiece 200, devices 204 are formed in regions defined in a grid pattern on a front surface 202 of the substrate 201 by a plurality of streets 203.

The devices 204 are, for example, semiconductor devices such as integrated circuits (ICs) or large scale integrations (LSIs), or image sensors such as charge coupled devices (CCDs) or complementary metal oxide semiconductors (CMOSs). In the first embodiment, the workpiece 200 includes a metal film 206 formed on a back surface 205 of the substrate 201. The back surface 205 is located on a side opposite to the front surface 202. As the metal film 206 is formed on the back surface 205, the streets 203 cannot be detected even if the workpiece 200 is imaged by an infrared camera from the side of the back surface 205.

On the workpiece 200, key patterns 207 are formed corresponding to the respective devices 204. These key patterns 207 are used as detection targets at the time of alignment for positional registration between the workpiece 200 and a cutting blade 21 of the processing apparatus 1. As the key patterns 207, characteristic portions of circuits in the devices 204 are used, for example. In the first embodiment, the key patterns 207 are each formed in a cruciform shape including two linear marks 208 and 209 that intersect with each other and are parallel to the corresponding streets 203. In the first embodiment, the workpiece 200 is bonded at the front surface 202 thereof to a tape 211, to an outer peripheral edge portion of which an annular frame 210 is attached, and is therefore supported on the annular frame 210 with the metal film 206 on the side of the back surface 205 being directed upward.

The processing apparatus 1 depicted in FIG. 1 is a cutting apparatus in which the workpiece 200 is held by a chuck table 12 of a holding unit 10 and is cut along the streets 203 by the cutting blade 21, so that the workpiece 200 is divided into the individual devices 204. As depicted in FIG. 1, the processing apparatus 1 includes the holding unit 10, a cutting unit 20, a processing feed unit 30 that performs processing feed of the holding unit 10 in an X-axis direction (processing feed direction) parallel to a horizontal direction, an indexing feed unit 40 that performs indexing feed of the cutting unit 20 in a Y-axis direction (indexing feed direction) parallel to the horizontal direction and perpendicular to the X-axis direction, an undepicted cutting-in feed unit that performs cutting-in feed of the cutting unit 20 in a Z-axis direction perpendicular to both the X-axis direction and the Y-axis direction, a camera 50, and a control unit 100.

As depicted in FIGS. 1 and 3, the holding unit 10 has a housing 11 that is moved in the X-axis direction by the processing feed unit 30, the chuck table 12 rotatably disposed on the housing 11, and a rotary drive unit 13 that rotates the chuck table 12 about its axis parallel to the Z-axis direction.

The chuck table 12 holds the workpiece 200 on a holding surface 124, and is rotatable about its axis parallel to the Z-axis. The chuck table 12 is formed in a disc shape, and includes a frame 122 with a recessed portion 121 centrally formed in an upper surface thereof and a disc-shaped transparent member 123 fitted in the recessed portion 121 of the frame 122 and forming the holding surface 124.

The frame 122 is formed with a metal such as stainless steel, and is rotated by the rotary drive unit 13 about its axis parallel to the Z-axis direction. The transparent member 123 is formed from a transparent material such as quartz glass, borosilicate glass, sapphire, calcium fluoride, lithium fluoride, or magnesium fluoride, and has, as the holding surface 124, an upper surface through which a number of undepicted apertures opens. The workpiece 200 is mounted on the holding surface 124 via the tape 211, with the side of the front surface 202 kept in contact with the holding surface 124.

The chuck table 12 includes a space formed in the recessed portion 121 and connected to an undepicted vacuum suction source. When air is drawn through the space by the vacuum suction source, the workpiece 200 mounted on the holding surface 124 is held under suction. In the first embodiment, the chuck table 12 holds the workpiece 200 on the side of the front surface 202 under suction via the tape 211. It is to be noted that, in the first embodiment, the tape 211 and the annular frame 210 protrude to an outer peripheral side of the chuck table 12 when the workpiece 200 is held under suction on the chuck table 12.

The rotary drive unit 13 serves to rotate the chuck table 12 about its axis parallel to the Z-axis direction. The rotary drive unit 13 rotates the chuck table 12 about its axis in a range greater than 180 degrees and smaller than 360 degrees. The rotary drive unit 13 is disposed on the housing 11 that is subjected to processing feed in the X-axis direction by the processing feed unit 30. The rotary drive unit 13 includes a motor 131 fixed on a side wall of the housing 11, a pulley 132 connected to an output shaft of the motor 131, and a belt 133 wrapped on an outer periphery of the chuck table 12 and rotationally driven by the pulley 132 about the axis of the chuck table 12. When the motor 131 for the rotary drive unit 13 is driven, the chuck table 12 is rotated about the axis thereof via the pulley 132 and the belt 133. In the first embodiment, the rotary drive unit 13 can rotate the chuck table 12, for example, 220 degrees both in one direction about the axis thereof and in an opposite direction that is a reverse direction to the one direction.

The cutting unit 20 is a processing unit that cuts, by the cutting blade 21, the workpiece 200 held on the chuck table 12. Relative to the workpiece 200 held on the chuck table 12, the cutting unit 20 is disposed movably in the Y-axis direction by the indexing feed unit 40 and is also disposed movably in the Z-axis direction by the undepicted cutting-in feed unit. The cutting unit 20 is disposed on a support frame (not depicted), which is disposed upright from an apparatus main body 2, by way of the indexing feed unit 40, the cutting-in feed unit, and the like.

The cutting unit 20 can place the cutting blade 21 at a desired position on the holding surface 124 of the chuck table 12 by the indexing feed unit 40 and the cutting-in feed unit. The cutting unit 20 includes the cutting blade 21, a spindle housing 22 disposed movably in the Y-axis direction and the Z-axis direction by the indexing feed unit 40 and the cutting-in feed unit, and a spindle 23 arranged rotatably about its axis on the spindle housing 22, driven by a motor (not depicted), and carrying the cutting blade 21 mounted on a tip portion thereof.

The cutting blade 21 is an ultrathin cutting stone having a substantially ring shape. In the first embodiment, the cutting blade 21 is a what-is-called hub blade including a circular hub and an annular cutting edge. The annular cutting edge is disposed on an outer peripheral edge of the circular hub and is used to cut the workpiece 200. The cutting edge is made from abrasive grains of diamond, cubic boron nitride (CBN), or the like and a bonding material (binder) such as a metal or a resin, and is formed with a predetermined thickness. It is to be noted that, in the present invention, the cutting blade 21 may be a what-is-called washer blade configured of only a cutting edge.

The spindle 23 rotates about its axis by the motor, thereby rotating the cutting blade 21 about its axis. It is to be noted that the axes of the cutting blade 21 and the spindle 23 in the cutting unit 20 are parallel to the Y-axis direction.

The processing feed unit 30 relatively moves the chuck table 12 and the cutting unit 20 in the X-axis direction, and in the first embodiment, moves the chuck table 12 in the X-axis direction. As appreciated from the foregoing, the term "processing feed" as used in this invention means to move the chuck table 12 in the X-axis direction. As depicted in FIGS. 1 and 3, the processing feed unit 30 includes a known ball screw 31 disposed rotatably about its axis, a known pulse motor 32 that rotates the ball screw 31 about its axis, and known guide rails 33 supporting the housing 11 movably in the X-axis direction. The ball screw 31 and the guide rails 33 are parallel to the X-axis direction.

The processing feed unit 30 moves the holding unit 10 via the housing 11 along the guide rails 33 between a processing zone (see FIG. 4) and an imaging zone 5 (see FIG. 4). In the processing zone 3, the workpiece 200 held on the chuck table 12 is cut by the cutting unit 20. In the imaging zone 5, the workpiece 200 is imaged by the camera 50 at a position that is apart from the processing zone 3 by a predetermined distance 4 (see FIG. 4) in the X-axis direction.

In the first embodiment, the processing zone 3 includes a position of the chuck table 12 (indicated by solid lines in FIG. 4) when the workpiece 200 held on the chuck table 12 is cut by the cutting unit 20 at one end thereof on a right side in the X-axis direction in FIG. 4, and a position of the chuck table 12 (indicated by dashed lines in FIG. 4) when the workpiece 200 held on the chuck table 12 is cut by the cutting unit 20 at an opposite end thereof on a left side in the X-axis direction in FIG. 4. The imaging zone 5 is apart from the processing zone 3 by the predetermined distance 4 rightward in FIG. 4. Further, the processing zone 3 is a guaranteed range in which the linear travel accuracy of the chuck table 12 along the guide rails 33 has an accuracy needed to divide the workpiece 200 into the individual devices 204, while the imaging zone 5 is a non-guaranteed range in which the linear travel accuracy of the chuck table 12 along the guide rails 33 does not have the accuracy needed to divide the workpiece 200 into the individual devices 204. The term "the linear travel accuracy" of the chuck table 12 along the guide rails 33 means an extent of a deviation of a movement trajectory of the chuck table 12 along the guide rails 33 from the X-axis direction.

The indexing feed unit 40 relatively moves the chuck table 12 and the cutting unit 20 in the Y-axis direction, and in the first embodiment, moves the cutting unit 20 in the Y-axis direction. The cutting-in feed unit relatively moves the chuck table 12 and the cutting unit 20 in the Z-axis direction, and in the first embodiment, moves the cutting unit 20 in the Z-axis direction. The indexing feed unit 40 and the cutting-in feed unit each include a known ball screw disposed rotatably about its axis, a known pulse motor that rotates the ball screw about its axis, and known guide rails supporting the cutting unit 20 movably in the Y-axis direction or Z-axis direction.

The camera 50 images the workpiece 200 held on the chuck table 12, and is movable in the Y-axis direction. As depicted in FIG. 1, the camera 50 has, at positions which are up and down with the transparent member 123 interposed therebetween, a first camera 51 disposed in a vicinity of the cutting unit 20, and a second camera 52 that is more distant than the first camera 51 from the cutting unit 20.

The first camera 51 images the workpiece 200 held on the chuck table 12 from above the holding surface 124. In the first embodiment, the first camera 51 is fixed on the spindle housing 22 of the cutting unit 20 such that the first camera 51 moves integrally with the cutting unit 20, and is disposed in the vicinity of the cutting unit 20. The first camera 51 is fixed on the spindle housing 22 of the cutting unit 20, and therefore is movable in the Y-axis direction by the indexing feed unit 40. In the first embodiment, the first camera 51 is arranged at a position where the center of its imaging area is located side by side with the cutting blade 21 in the X-axis direction.

The first camera 51 includes an imaging element that images, from above, the workpiece 200 held on the holding unit 10 located in the processing zone 3 as the guaranteed range. Therefore, the first camera 51 is arranged in the guaranteed range. The imaging element is, for example, a CCD imaging element or a CMOS imaging element. The first camera 51 images the workpiece 200 held on the chuck table 12 from above to capture a first image 301 (see FIGS. 5 and 6), and outputs the first image 301 to the control unit 100.

The second camera 52 images the workpiece 200 held on the chuck table 12 from below the holding surface 124 through the holding surface 124. In the first embodiment, the second camera 52 is arranged on a side farther than (on a right side of) the processing feed unit 30 in FIG. 1, and is arranged more distant than the first camera 51 from the cutting unit 20. Meanwhile, the second camera 52 is arranged on a movable plate 54 that is moved in the Y-axis direction by a Y-axis moving unit 53 disposed on the apparatus main body 2, and is therefore movable in the Y-axis direction by the Y-axis moving unit 53. The second camera 52 is also movable in the Z-axis direction by a Z-axis moving unit 55 disposed on the movable plate 54.

The Y-axis moving unit 53 and the Z-axis moving unit 55 each include a known ball screw rotatably disposed about its axis, a known pulse motor that rotates the ball screw about its axis, and known guide rails movably supporting the movable plate 54 or the second camera 52 in the Y-axis direction or the Z-axis direction.

The second camera 52 includes an imaging element that images, from below through the transparent member 123, the workpiece 200 held on the holding unit 10 located in the imaging zone 5 as the non-guaranteed range. Therefore, the second camera 52 is arranged in the non-guaranteed range. The imaging element is, for example, a CCD imaging element or a CMOS imaging element. The second camera 52 images the workpiece 200 held on the chuck table 12 from below through the transparent member 123 to capture a second image 302 (see FIGS. 5 and 6), and outputs the second image 302 to the control unit 100. It is to be noted that, in the first embodiment, the second image 302 is also used to perform an alignment.

The control unit 100 controls the above-described individual elements of the processing apparatus 1 independently or in combination to make the processing apparatus 1 perform a processing operation on the workpiece 200. The control unit 100 is a computer including an arithmetic and logic processing unit having a microprocessor such as a central processing unit (CPU), a storage device having a memory such as a read only memory (ROM) or a random access memory (RAM), and an input/output interface device. The arithmetic and logic processing unit of the control unit 100 performs arithmetic and/or logic processing in accordance with a computer program stored in the storage device, and outputs control signals for the processing apparatus 1 to the above-described elements of the processing apparatus 1 via the input/output interface device.

Further, the processing apparatus 1 is connected to a display unit 110 and an input unit (not depicted). The display unit 110 includes a liquid crystal display device or the like that is connected to the control unit 100 and displays status of processing operations, images, and so on. The input unit is connected to the control unit 100, and is used when an operator records information regarding processing details and the like. In the first embodiment, the input unit includes at least one of a touch panel incorporated in the display unit 110 or an external input device such as a keyboard.

The display unit 110 displays the first image 301 captured by the first camera 51 and the second image 302 captured by the second camera 52. The control unit 100 receives an operation from the operator via the input unit, and generates control signals pursuant to the operation from the operator. Based on the control signals, the display unit 110 displays the first image 301 and the second image 302 in juxtaposition in the X-axis direction as illustrated in FIG. 5 or in superposition as illustrated in FIG. 6.

When displaying the first image 301 and the second image 302, the display unit 110 displays them with one of the first image 301 and the second image 302 being inverted in the X-axis direction. The expression "with one of the first image 301 and the second image 302 being inverted in the X-axis direction" means that both the first image 301 and the second image 302 are displayed as images captured by imaging the workpiece 200 held on the chuck table 12 from above, or that both the first image 301 and the second image 302 are displayed as images captured by imaging the workpiece 200 held on the chuck table 12 from below. In the first embodiment, the display unit 110 displays on a display screen such that both the first image 301 and the second image 302 are displayed as images captured by imaging the workpiece 200 held on the chuck table 12 from above. In the first embodiment, the display unit 110 can display the first and second images 301 and 302 both in juxtaposition in the X-axis direction and in superposition. In the present invention, however, it is sufficient if at least one of these display modes is feasible.

The processing apparatus 1 also includes an X-axis direction position detection unit for detecting the position of the chuck table 12 in the X-axis direction, a Y-axis direction position detection unit for detecting the position of the cutting unit 20 in the Y-axis direction, a Z-axis direction position detection unit for detecting the position of the cutting unit 20 in the Z-axis direction, and an angle detection unit for detecting the rotation angle of the cutting unit 20 about its axis. The X-axis direction position detection unit and the Y-axis direction position detection unit can each include a linear scale parallel to the X-axis direction or the Y-axis direction, and a reading head that is disposed movably in the X-axis direction or the Y-axis direction by the processing feed unit 30 or the indexing feed unit 40 and reads gradations of the linear scale. The Z-axis direction position detection unit can detect the position of the cutting unit 20 in the Z-axis direction by counting the number of pulses of the pulse motor that rotates the associated ball screw about its axis. The processing apparatus 1 also includes a second Y-axis direction position detection unit for detecting the position of the second camera 52 in the Y-axis direction. Each detection unit outputs detection results to the control unit 100.

The detection unit 100 also includes a correction amount calculation section 101, a coordinate calculation section 102, a coordinate storage section 103, an image control section 104, and an imaging area control section 105. The correction amount calculation section 101 forms a cut groove 400 (see FIGS. 4, 8, and 9) as a linear processed mark in the workpiece 200 (hereinafter designated by numeral 200-1), which is depicted in FIG. 7 and is held under suction on the chuck table 12, by the cutting unit 20 while moving the chuck table 12 from the processing zone 3 toward the imaging zone 5 in the X-axis direction. The coordinate calculation section 102 detects the cut groove 400 from the first image 301 and the second image 302, and calculates X-coordinates and Y-coordinates of a center 401 of the cut groove 400. The coordinate storage section 103 stores the X-coordinates and Y-coordinates of the center 401 of the cut groove 400 in the first and second images 301 and 302 as calculated by the coordinate calculation section 102.

In the first embodiment, the workpiece 200-1 depicted in FIG. 7 is a what-is-called dummy wafer formed of the substrate 201 alone, which includes neither the devices 204 formed on the front surface 202 nor the metal film 206 formed on the back surface 205. In the workpiece 200-1, portions identical to those of the workpiece 200 as the object to be processed by the processing apparatus 1 are identified by the same numerals, and their description will be omitted herein. Similar to the workpiece 200 as the object to be processed by the processing apparatus 1, the workpiece 200-1 is bonded at the front surface 202 thereof to the tape 211, to the outer peripheral edge portion of which the annular frame 210 is attached and is therefore supported on the annular frame 10, so that the workpiece 200-1 is held under suction on the chuck table 12. The cut groove 400 extends through the substrate 201 of the workpiece 200-1 from the back surface 205 to the front surface 202, and is formed linearly along the X-axis direction because the processing zone 3 is the guaranteed range.

The coordinate calculation section 102 extracts the cut groove 400 from the first and second images 301 and 302 captured through imaging by the first and second cameras 51 and 52. The coordinate calculation section 102 calculates, from the detection results of the X-axis direction position detection unit and the Y-axis direction position detection unit, the X coordinate in the X-axis direction and the Y coordinate in the Y-axis direction of the center 401 of the cut groove 400 in the first image 301. In addition, the coordinate calculation section 102 also calculates, from the detection results of the X-axis direction position detection unit and the second Y-axis direction position detection unit, the X coordinate in the X-axis direction and the Y coordinate in the Y-axis direction of the center 401 of the cut groove 400 in the second image 302. It is to be noted that, in the first embodiment, the coordinate calculation section 102 presents an X coordinate in terms of a distance in the X-axis direction from a predetermined reference position on the holding surface 124, and presents a Y coordinate in terms of a distance in the Y-axis direction from the predetermined reference position the holding surface 124.

Figure 13:
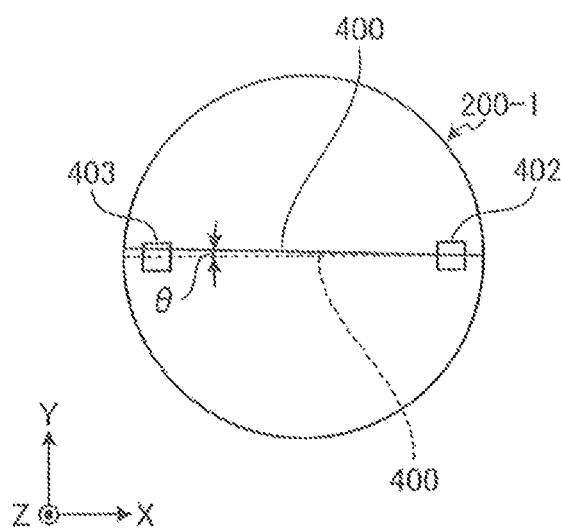
FIG. 13 is a plan view, as seen from below, of the workpiece in the imaging zone as illustrated in FIG. 12.

Because the imaging zone 5 falls in the non-guaranteed range, the cut groove 400 extracted from the second image 302 and indicated by a solid line in FIG. 13, as viewed in plan, is tilted with respect to the cut groove 400 extracted from the first image 301 and indicated by a dashed line in FIG. 13. Therefore, each position of the cut groove 400 in the first image 301 captured by the first camera 51 and the corresponding position of the cut groove 400 in the second image 302 captured by the second camera 52 deviate from each other in the X-axis direction and in the Y-axis direction.

The correction amount calculation section 101, the coordinate calculation section 102, the coordinate storage section 103, and the image control section 104 perform a correction amount calculation operation to calculate correction amounts for a deviation between each position of the cut groove 400 in the first image 301 captured by the first camera 51 and the corresponding position of the cut groove 400 in the second image 302 captured by the second camera 52, thereby enabling the first camera 51 and the second camera 52 to image the same position on the workpiece 200 held on the chuck table 12. This correction amount calculation operation is performed at the time of shipment of the processing apparatus 1 from a factory and also at periodic timings (for example, every year) after its shipment from the factory.

Figure 8:
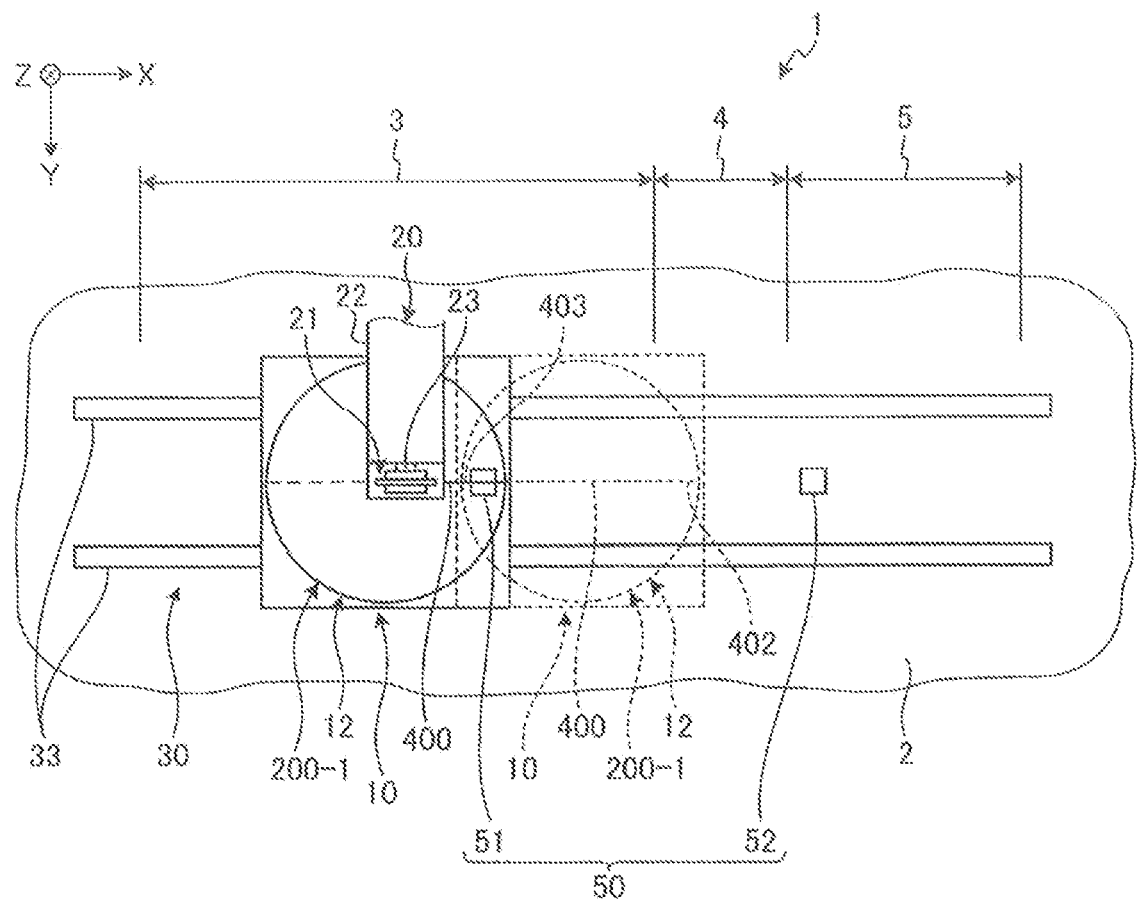
FIG. 8 is a plan view schematically illustrating a state in which the correction amount calculation section of the processing apparatus depicted in FIG. 1 is forming the cut groove in the workpiece depicted in FIG. 7.
Figure 9:
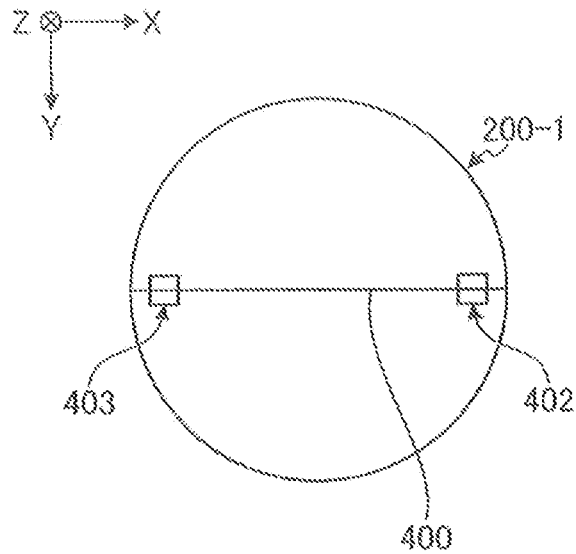
FIG. 9 is a plan view schematically illustrating a state in which the correction amount calculation section of the processing apparatus depicted in FIG. 1 has formed the cut groove in the workpiece depicted in FIG. 7.
Figure 10:
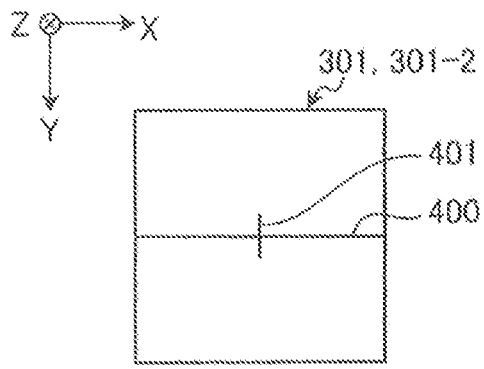
FIG. 10 is a view illustrating a first image that a first camera of the processing apparatus depicted in FIG. 1 has captured by imaging one end portion of the cut groove.
Figure 11:
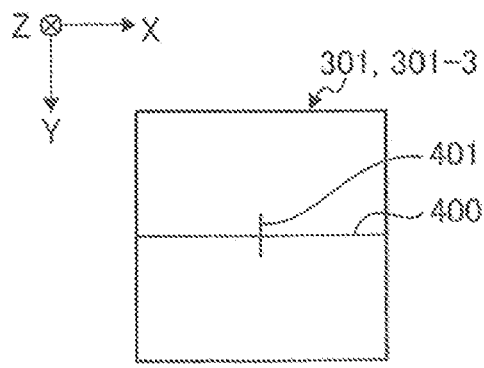
FIG. 11 is a view illustrating another first image that the first camera of the processing apparatus depicted in FIG. 1 has captured by imaging an opposite end portion of the cut groove.
Figure 12:
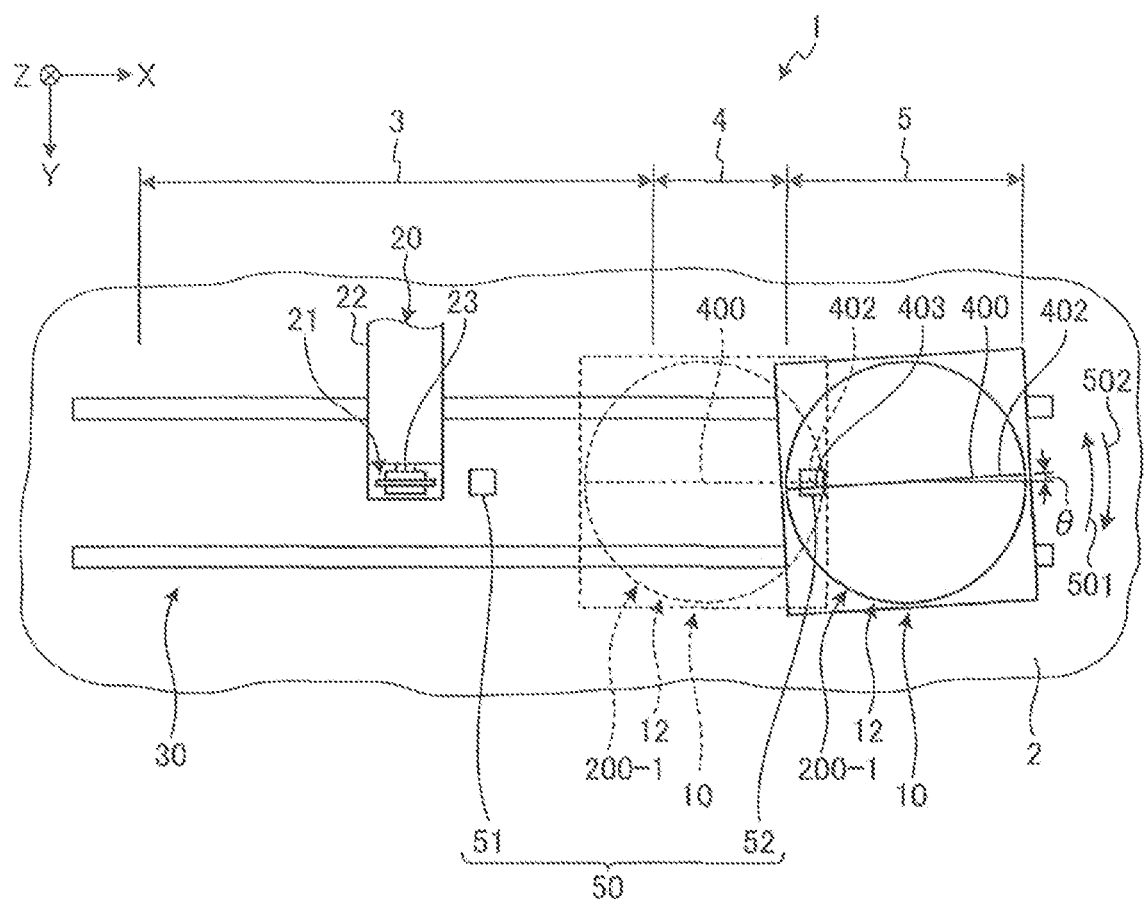
FIG. 12 is a plan view schematically illustrating a state in which the correction amount calculation section of the processing apparatus depicted in FIG. 1 is moving the workpiece with the cut groove formed therein to the imaging zone.
Figure 14:
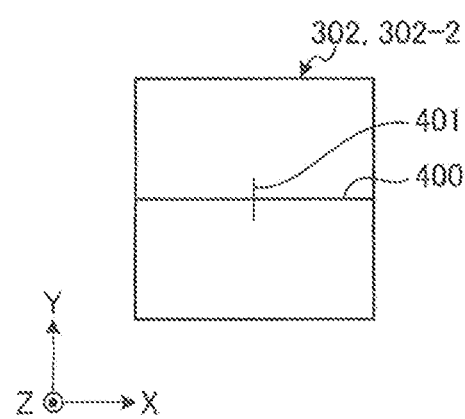
FIG. 14 is a view illustrating a second image that a second camera of the processing apparatus depicted in FIG. 1 has captured by imaging the one end portion of the cut groove.
Figure 15:
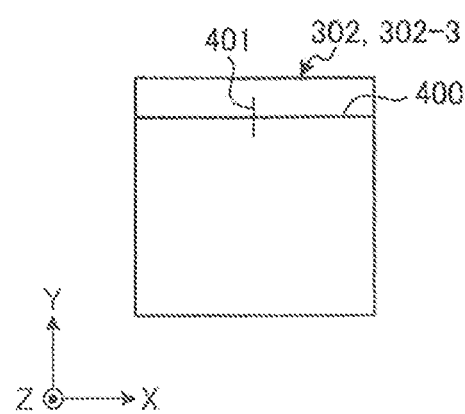
FIG. 15 is a view illustrating another second image that the second camera of the processing apparatus depicted in FIG. 1 has captured by imaging the opposite end portion of the cut groove.
Figure 16:
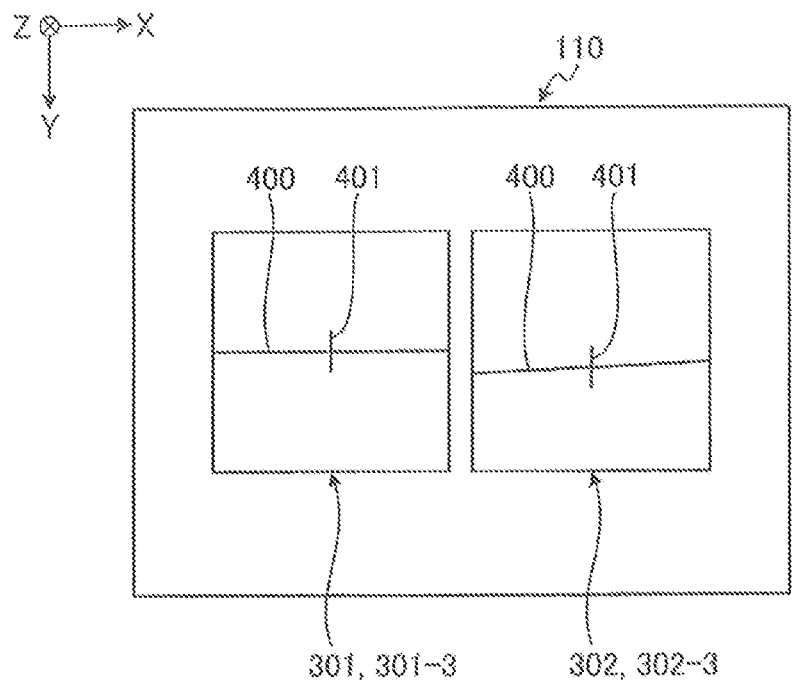
FIG. 16 is a view illustrating a state in which the display unit of the processing apparatus depicted in FIG. 1 displays the first image and the second image in juxtaposition.
Figure 17:
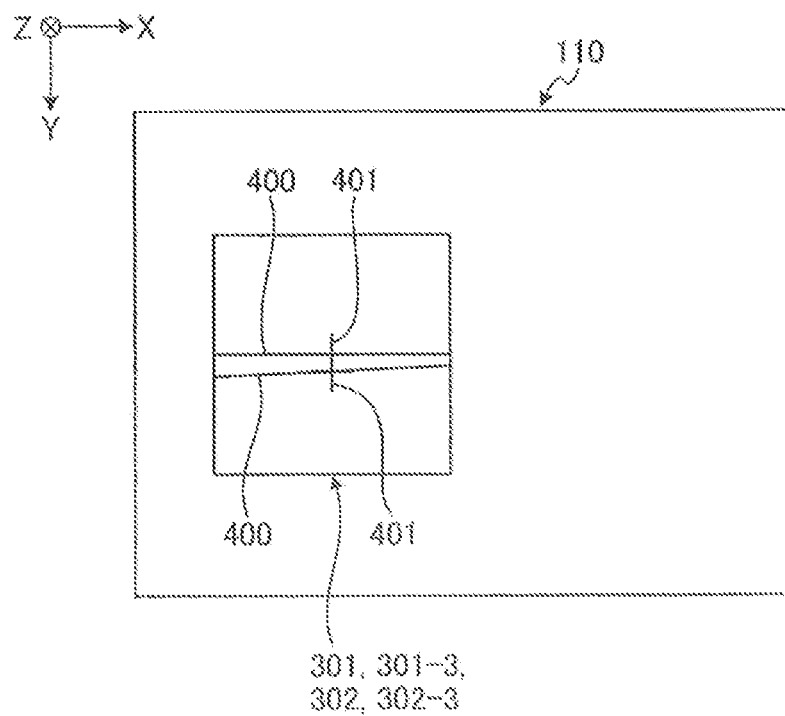
FIG. 17 is a view illustrating a state in which the display unit of the processing apparatus depicted in FIG. 1 displays the first image and the second image in superposition.

Next, a description will be made of the correction amount calculation operation while describing the individual elements of the control unit 100. FIG. 8 is a plan view schematically illustrating a state in which the correction amount calculation section of the processing apparatus depicted in FIG. 1 is forming the cut groove in the workpiece depicted in FIG. 7. FIG. 9 is a plan view schematically illustrating a state in which the correction amount calculation section of the processing apparatus depicted in FIG. 1 has formed the cut groove in the workpiece depicted in FIG. 7. FIG. 10 is a view illustrating a first image that the first camera of the processing apparatus depicted in FIG. 1 has captured by imaging one end portion of the cut groove. FIG. 11 is a view illustrating another first image that the first camera of the processing apparatus depicted in FIG. 1 has captured by imaging an opposite end portion of the cut groove. FIG. 12 is a plan view schematically illustrating a state in which the correction amount calculation section of the processing apparatus depicted in FIG. 1 is moving the workpiece with the cut groove formed therein to the imaging zone. FIG. 13 is a plan view as seen from below of the workpiece in the imaging zone illustrated in FIG. 12. FIG. 14 is a view illustrating a second image that the second camera of the processing apparatus depicted in FIG. 1 has captured by imaging the one end portion of the cut groove. FIG. 15 is a view illustrating another second image that the second camera of the processing apparatus depicted in FIG. 1 has captured by imaging the opposite end portion of the cut groove. FIG. 16 is a view illustrating a state in which the display unit of the processing apparatus depicted in FIG. 1 displays the first image and the second image in juxtaposition. FIG. 17 is a view illustrating a state in which the display unit of the processing apparatus depicted in FIG. 1 displays the first image and the second image in superposition.

In the correction amount calculation operation, the operator mounts the workpiece 200 on the holding surface 124 of the chuck table 12 in the holding unit 10 via the tape 211. When the control unit 100 subsequently receives a start instruction from the operator, the processing apparatus 1 starts a correction amount calculation operation.

In the correction amount calculation operation, the control unit 100 rotates the cutting blade 21 of the cutting unit 20, and holds the workpiece 200 under suction on the holding surface 124 of the chuck table 12 of the holding unit 10 via the tape 211. While moving the chuck table 12, which is indicated by the solid lines in FIG. 8, from the processing zone 3 to the imaging zone 5 via a position where the chuck table 12 is indicated by the dashed lines, the correction amount calculation section 101 causes the cutting blade 21 to cut into the workpiece 200 until the cutting blade 21 reaches the tape 211. The correction amount calculation section 101 forms the cut groove 400 in the workpiece 200-1 as illustrated in FIGS. 8 and 9, and then causes the first camera 51 to image predetermined positions on opposite end portions 402 and 403 of the cut groove 400.

Described specifically, after the formation of the cut groove 400 illustrated in FIG. 9, the first camera 51 images the one end portion 402 of the cut groove 400 to capture a first image 301 (hereinafter designated by numeral 301-2) illustrated in FIG. 10, and also images the opposite end portion 403 of the cut groove 400 to capture another first image 301 (hereinafter designated by numeral 301-3) illustrated in FIG. 11. The correction amount calculation section 101 acquires the first image 301-2 and the first image 301-3.

The coordinate calculation section 102 calculates the X coordinate (X1) and Y coordinate (Y1) of the center 401 of the cut groove 400 in the first image 301-2, and the coordinate storage section 103 stores the coordinates (X1, Y1) of the center 401 of the cut groove 400 in the first image 301-2. The coordinate calculation section 102 calculates the X coordinate (X2) and Y coordinate (Y1) of the center 401 of the cut groove 400 in the first image 301-3, and the coordinate storage section 103 stores the coordinates (X2, Y1) of the center 401 of the cut groove 400 in the first image 301-3. In this manner, the coordinate calculation section 102 calculates the coordinates (X1, Y1) of the center 401 of the one end portion 402 of the cut groove 400 in the processing zone 3 and the coordinates (X2, Y1) of the center 401 of the opposite end portion 403 of the cut groove 400 in the processing zone 3, and the coordinate storage section 103 stores the coordinates (X1, Y1) and the coordinates (X2, Y1).

When the chuck table 12 is moved as mentioned above, the chuck table 12 approaches the imaging zone 5 as illustrated by the dashed lines in FIG. 8. After the chuck table 12 has approached the imaging zone 5 as indicated by the dashed lines in FIG. 12, the correction amount calculation section 101 moves the chuck table 12 further toward the imaging region 5, and then causes the second camera 52 to image the predetermined positions (the same positions as the imaging positions by the first camera 51) on the opposite end portions 402 and 403 (see FIG. 13) of the cut groove 400. Described specifically, the second camera 52 images the one end portion 402 of the cut groove 400 to capture a second image 302 (hereinafter designated by numeral 302-2) illustrated in FIG. 14, and also images the opposite end portion 403 of the cut groove 400 to capture another second image 302 (hereinafter designated by numeral 302-3) illustrated in FIG. 15. The correction amount calculation section 101 acquires the second image 302-2 and the second image 302-3.

The coordinate calculation section 102 calculates the X coordinate (X1) and Y coordinate (Y2) of the center 401 of the cut groove 400 in the second image 302-2, and the coordinate storage section 103 stores the coordinates (X1, Y2) of the center 401 of the cut groove 400 in the second image 302-2. The coordinate calculation section 102 calculates the X coordinate (X2) and Y coordinate (Y3) of the center 401 of the cut groove 400 in the second image 302-3, and the coordinate storage section 103 stores the coordinates (X2, Y3) of the center 401 of the cut groove 400 in the second image 302-3. In this manner, the coordinate calculation section 102 calculates the coordinates (X1, Y2) of the center 401 of the one end portion 402 of the cut groove 400 in the imaging zone 5 and the coordinates (X2, Y3) of the center 401 of the opposite end portion 403 of the cut groove 400 in the imaging zone 5, and the coordinate storage section 103 stores the coordinates (X1, Y2) and the coordinates (X2, Y3).

From the above-mentioned coordinates (X1, Y1), (X2, Y1), (X1, Y2), and (X2, Y3), the correction amount calculation section 101 calculates an angle θ formed by the cut groove 400 extracted from the second image 302 and indicated by the solid line in FIG. 13 and the cut groove 400 extracted from the first image 301 and indicated by the dashed line in FIG. 13. Specifically, the angle θ is calculated by the following formula 1.

$$\theta = \tan^{-1}\{(Y3-Y2)/(X2-X1)\} \quad \text{Formula 1}$$

The correction amount calculation section 101 stores the angle θ, which has been calculated by the formula 1, as a correction value, i.e., a correction angle for the chuck table 12 in the coordinate storage section 103.

In addition, the correction amount calculation section 102 also calculates, from the above-mentioned coordinates (X1, Y1), (X2, Y1), (X1, Y2), and (X2, Y3), a difference between the Y coordinates of the same position (the position of the same X coordinate) on the holding surface 124 in the processing zone 3 and the imaging zone 5. Specifically, at the position of the coordinate (X1), the difference between the Y coordinates is calculated to be (Y2−Y1), and at the position of the coordinate (X2), the difference between the Y coordinates is calculated to be (Y3−Y1). The difference of the Y coordinates at the respective positions between the coordinate (X1) and the coordinate (X2) is then calculated using the above-mentioned difference (Y2−Y1) of the Y coordinates, the above-mentioned difference (Y3−Y1) of the Y coordinates and the above-mentioned angle θ.

The correction amount calculation section 101 stores, as correction values in the Y-axis direction in the imaging zone 5, the above-mentioned difference (Y2−Y1) of the Y-coordinates, the above-mentioned difference (Y3−Y1) of the Y coordinates, and the difference of the Y coordinates at the respective positions between the coordinate (X1) and the coordinate (X2), in the coordinate storage section 103. In short, taking into consideration a phenomenon that a deviation of a second predetermined value (mm) occurs in the Y-axis direction if processing feed is performed over a first predetermined value (mm) in the X-axis direction, the correction amount calculation section 101 calculates the correction values in the Y-axis direction in the imaging zone 5 and stores them in the coordinate storage section 103.

As described above, the correction amount calculation section 101 calculates the correction values in the Y-axis direction and the correction angle for the chuck table 12, both, in the imaging zone 5 from the Y coordinates (Y1), (Y2), (Y3), etc. of the centers 401 of both of the end portions 402 and 403 of the single cut groove 400, the centers 401 being two points that are apart from each other in the X-axis direction on the cut groove 400 and stores them in the coordinate storage section 103. In the first embodiment, the correction amount calculation section 101 calculates both the correction values in the Y-axis direction and the correction angle for the chuck table 12 and stores them in the coordinate storage section 103. In the present invention, however, it is sufficient to calculate and store at least either the correction values or the correction angle.

The coordinate storage section 103 positions the second camera 52 below both of the end portions 402 and 403 of the cut groove 400, the end portions 402 and 403 being the regions imaged by the first camera 51, and causes the second camera 52 to image the end portions 402 and 403, and stores the difference (Y2−Y1) of the Y coordinates at the coordinate (X1), the difference (Y3−Y1) of the Y coordinates at the coordinate (X2), and the difference of the Y coordinates at the respective positions between the coordinate (X1) and the coordinate (X2), the differences having been calculated by the correction amount calculation section 101, so that the positional deviation between the imaging area of the first camera 51 and the imaging area of the second camera 52 is stored as X coordinates and Y coordinates. As appreciated from the foregoing, the difference (Y2−Y1) of the Y coordinates at the coordinate (X1), the difference (Y3−Y1) of the Y coordinates at the coordinate (X2), and the difference of the Y coordinates at the respective positions between the coordinate (X1) and the coordinate (X2) indicate, as X coordinates and Y coordinates, the positional deviation between the imaging area of the first camera 51 and the imaging area of the second camera 52.

In the correction amount calculation operation, the image control section 104 receives the operation from the operator via the input unit, outputs to the display unit 110 control signals pursuant to the operation from the operator, and displays the first image 301 and the second image 302 in juxtaposition in the X-axis direction on the display unit 110 as illustrated in FIG. 16 or displays the first image 301 and the second image 302 in superposition on the display unit 110 as illustrated in FIG. 17. It is to be noted that FIGS. 16 and 17 present examples of the display of the first and second images 301-3 and 302-3 of the opposite end portion 403 by the display unit 110. The correction amount control operation ends when the coordinate storage section 103 stores the correction values in the Y-axis direction and the correction angle for the chuck table 12.

To enable the second camera 52 to image the same position on the workpiece 200 as the first camera 51 based on the correction values in the Y-axis direction as stored in the coordinate storage section 103 when moving the chuck table 12 in the X-axis direction in the imaging zone 5 to perform an alignment by imaging the workpiece 200 held on the chuck table 12 with the second camera 52 in the processing operation by the processing apparatus 1, the imaging area control section 105 controls the Y-axis moving unit 53 to correct the position of the second camera 52 in the Y-axis direction. As an alternative, when moving the chuck table 12 in the X-axis direction in the imaging zone 5 to perform an alignment, the imaging area control section 105 controls the rotary drive unit 13 based on the correction angle for the chuck table 12 as stored in the coordinate storage section 103 to rotate the chuck table 12 about its axis according to the correction angle such that the second camera 52 can image the same position on the workpiece 200 as the first camera 51.

Specifically, the imaging area control section 105, when moving the chuck table 12 in the X-axis direction in the imaging zone 5 to perform an alignment, controls the Y-axis moving unit 53 by the stored correction values in the Y-axis direction to move the second camera 52 downward in FIG. 12 if the correction values in the Y-axis direction as stored in the coordinate storage section 103 indicate that the same position on the workpiece 200 is located on a more upper side in FIG. 12 in the imaging zone 5 than in the processing zone 3. Similarly, the imaging area control section 105 moves the second camera 52 upward by the stored correction values in the Y-axis direction in FIG. 12 if the correction values in the Y-axis direction as stored in the coordinate storage section 103 at the time of the alignment indicate that the same position on the workpiece 200 is located on a more lower side in FIG. 12 in the imaging zone 5 than in the processing zone 3.

Further, the imaging area control section 105, when moving the chuck table 12 in the X-axis direction in the imaging zone 5 to perform an alignment, controls the rotary drive unit 13 to rotate the chuck table 12 in a direction of an arrow 502 of FIG. 12 by the stored correction angle if the correction angle for the chuck table 12 as stored in the coordinate storage section 103 indicates that the same position on the workpiece 200 deviates more in a direction of the arrow 501 of FIG. 12 in the imaging zone 5 than in the processing zone 3. Similarly, the imaging area control section 105 rotates the chuck table 12 by the stored correction angle in the direction of the arrow 501 of FIG. 12 if the correction angle for the chuck table 12 as stored in the coordinate storage section 103 at the time of the alignment indicates that the same position on the workpiece 200 deviates more in the direction of the arrow 502 of FIG. 12 in the imaging zone 5 than in the processing zone 3.

In the processing operation by the processing apparatus 1, the cut groove 400 is imaged from above by the first camera 51, the cut groove 400 is imaged from below by the second camera 52, and a kerf check is then performed to determine whether or not a deviation of the cut groove 400, which has been formed in the workpiece 200, from a desired position and sizes or the like of chippings occurred on both edges of the cut groove 400 are within predetermined tolerances. Here, the imaging area control section 105 also corrects the position of the second camera 52 in the Y-axis direction. It is to be noted that a kerf check is conducted at a predetermined timing such as every time a predetermined number of cut grooves 400 has been formed or every time a predetermined number of workpieces 200 has been cut.

When performing the kerf check, the imaging area control section 105 uses, as a positional deviation between the imaging area of the first camera 51 and the imaging area of the second camera 52, the difference (Y2−Y1) of the Y coordinates at the coordinate (X1), the difference (Y3−Y1) of the Y coordinates at the coordinate (X2), and the difference of the Y coordinates at the respective positions between the coordinate (X1) and the coordinate (X2), all of which are stored in the coordinate storage section 103, and controls the Y-axis moving unit 53 to correct the position of the second camera 52 in the Y-axis direction such that the second camera 52 can image the same position on the workpiece 200 as the first camera 51.

Specifically, the imaging area control section 105, after imaging the workpiece 200 by the first camera 51 to perform the kerf check, controls the Y-axis moving unit 53 by the stored correction values in the Y-axis direction to move the second camera 52 downward in FIG. 12 and then images the workpiece 200 by the second camera 52 if the correction values in the Y-axis direction as stored in the coordinate storage section 103 indicate that the same position on the workpiece 200 is located on a more upper side in FIG. 12 in the imaging zone 5 than in the processing zone 3. Similarly, the imaging area control section 105, after imaging the workpiece 200 by the first camera 51 at the time of the kerf check, moves the second camera 52 upward by the stored correction values in the Y-axis direction in FIG. 12 and then images the workpiece 200 by the second camera 52 if the correction values in the Y-axis direction as stored in the coordinate storage section 103 indicate that the same position on the workpiece 200 is located on a more lower side in FIG. 12 in the imaging zone 5 than in the processing zone 3.

The respective functions of the correction amount calculation section 101, the coordinate calculation section 102, the image control section 104, and the image area control section 105 are realized through execution of computer programs, which are stored in the storage device of the control unit 100, by the arithmetic and logic processing unit. The function of the coordinate storage section 103 is realized by the storage device of the control unit 100.

Next, a description will be made regarding a processing operation by the processing apparatus 1. In the processing operation, the operator first records information regarding processing details in the control unit 100, and mounts the workpiece 200 on the holding surface 124 of the chuck table 12 of the holding unit 10 via the tape 211 prior to cutting processing. Subsequently, the processing apparatus 1 starts the processing operation when the control unit 100 receives a start instruction for the processing operation from the operator.

In the processing operation, the processing apparatus 1 controls the individual elements of the control unit 100, and after the workpiece 200 is held under suction on the holding surface 124 of the chuck table 12 via the tape 211, the cutting blade 21 of the cutting unit 20 is rotated, the chuck table 12 is moved to the imaging zone 5, and the chuck table 12 is stopped in the imaging zone 5. Based on the correction values in the Y-axis direction and the correction angle for the chuck table 12, which the imaging area control section 105 has stored in the coordinate storage section 103, the processing apparatus 1 adjusts the position of the second camera 52 in the Y-axis direction and the direction of the chuck table 12 about its axis based on the correction values in the Y-axis direction and the correction angle for the chuck table 12 as stored by the imaging area control section 105 in the coordinate storage section 103.

In the processing operation, the processing apparatus 1 further controls the individual elements of the control unit 100, and the workpiece 200 on the chuck table 12 is imaged from below by the second camera 52 and an alignment is performed to conduct positional registration between the workpiece 200 and the cutting blade 21. In the processing operation, with the check table 12 and the cutting blade 21 of the cutting unit 20 being relatively moved along a desired one of the streets 203, the cutting blade 21 is caused to cut into the workpiece 200 along the desired street 203 until the tape 211 is reached. The cutting unit 20 cuts, along the desired street 203, the workpiece 200 held on the chuck table 12, so that a cut groove is formed in the workpiece 200 along the desired street 203.

In the processing operation, the processing apparatus 1 also performs a kerf check at a predetermined timing. In the processing operation, the processing apparatus 1 ends the processing operation when the workpiece 200 has been cut along all the streets 203.

The above-described processing apparatus 1 according to the first embodiment includes the correction amount calculation section 101 that calculates the correction values in the Y-axis direction and the correction angle for the chuck table 12, both, in the imaging zone 5 from the coordinates (X1, Y1) and (X2, Y1) of the center 401 of the cut groove 400 as calculated from the first images 301-2 and 301-3 acquired by imaging both of the end portions 402 and 403 of the cut groove 400 by the first camera 51 and the coordinates (X1, Y2) and (X2, Y3) of the center 401 of the cut groove 400 as calculated from the second images 302-2 and 302-3 acquired by imaging both of the end portions 402 and 403 of the cut groove 400 by the second camera 52.

The processing apparatus 1 also includes the imaging area control section 105 that, when performing an alignment, moves the second camera 52 in the Y-axis direction and rotates the chuck table 12 about its axis based on the correction values in the Y-axis direction and the correction angle for the chuck table 12 as calculated by the correction amount calculation section 101 such that the first camera 51 and the second camera 52 image the same position on the workpiece 200.

When performing the alignment by imaging the workpiece 200 held on the chuck table 12 by the second camera 52 arranged in the non-guaranteed range, the processing apparatus 1 positions the second camera 52 such that the first camera 51 and the second camera 52 image the same position on the workpiece 200 held on the chuck table 12. The processing apparatus 1 can therefore perform the alignment accurately, thereby enabling to suppress processing at a wrong position in the processing operation.

Even if the workpiece 200 held on the chuck table 12 is imaged by the second camera 52 arranged in the non-guaranteed range, the processing apparatus 1 can also accurately perform an alignment, and therefore can suppress the need for costly guide rails or longer guide rails which would otherwise be required for the performance of an accurate alignment.

As a consequence, the processing apparatus 1 brings about an advantageous effect that a reduction in processing accuracy can be suppressed while suppressing an increase in cost.

Using the X coordinates and Y coordinates of the positional deviation between the imaging area of the first camera 51 and the imaging area of the second camera 52 as stored in the coordinate storage section 103, in other words, the difference (Y2−Y1) of the Y coordinates at the coordinate (X1), the difference (Y3−Y1) of the Y coordinates at the coordinate (X2), and the difference of the Y coordinates at the respective positions between the coordinate (X1) and the coordinate (X2) when performing the kerf check, the processing apparatus 1 also controls the Y-axis moving unit 53 to correct the position of the second camera 52 in the Y-axis direction such that the second camera 52 can image the same position on the workpiece 200 as the first camera 51.

When performing the kerf check, the processing apparatus 1 can therefore image the same position on the workpiece 200 by the first camera 51 arranged in the guaranteed range and the second camera 52 arranged in the non-guaranteed range. Accordingly, the processing apparatus 1 can accurately perform the kerf check from both above and below of the workpiece 200, and can suppress wrong determination as to processing results in the processing operation.

As a consequence, the processing apparatus 1 can bring about an advantageous effect that a kerf check can be precisely performed while suppressing an increase in cost.

Second Embodiment

Figure 18:
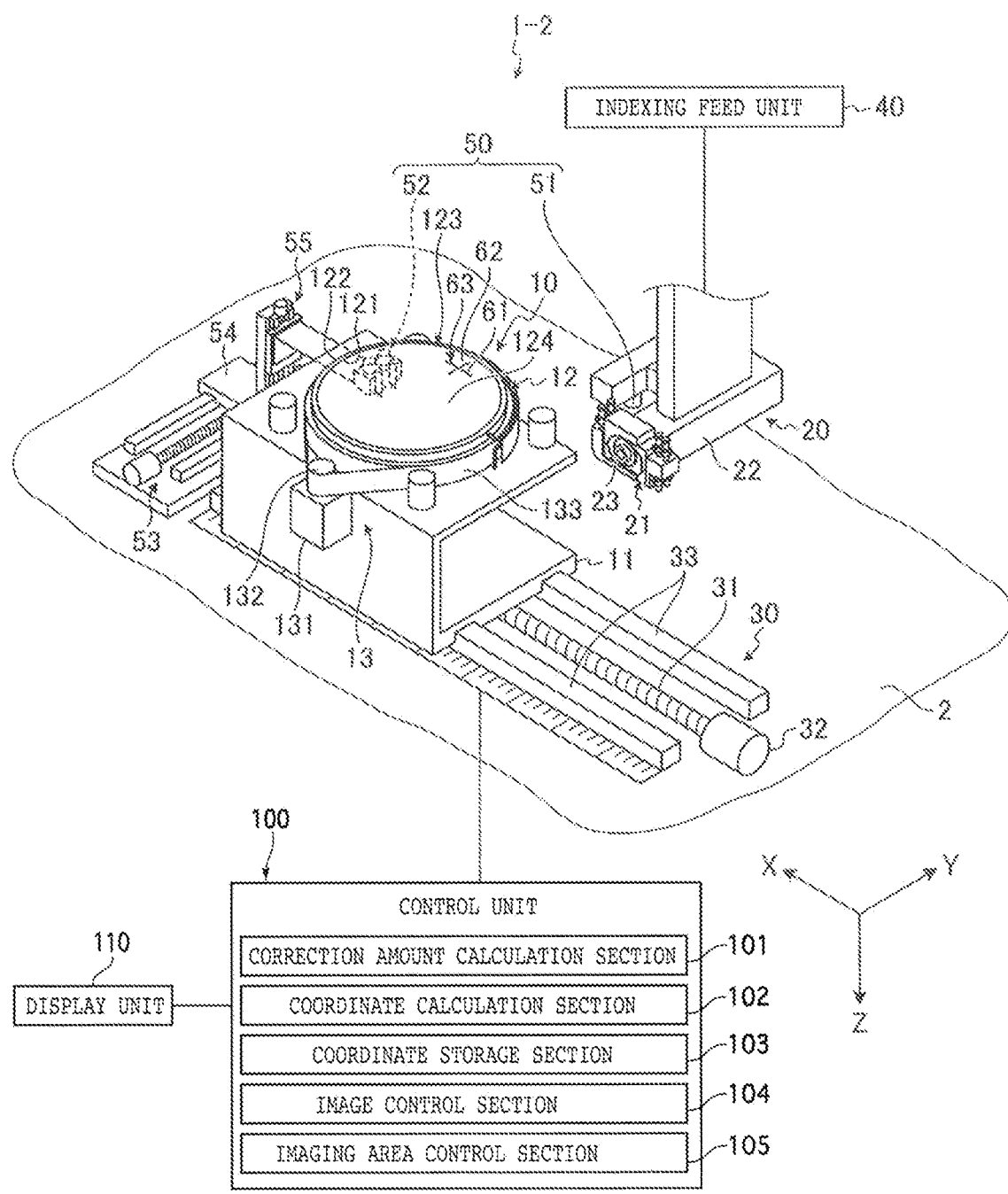
FIG. 18 is a perspective view depicting a configuration of part of a processing apparatus according to a second embodiment.
Figure 19:
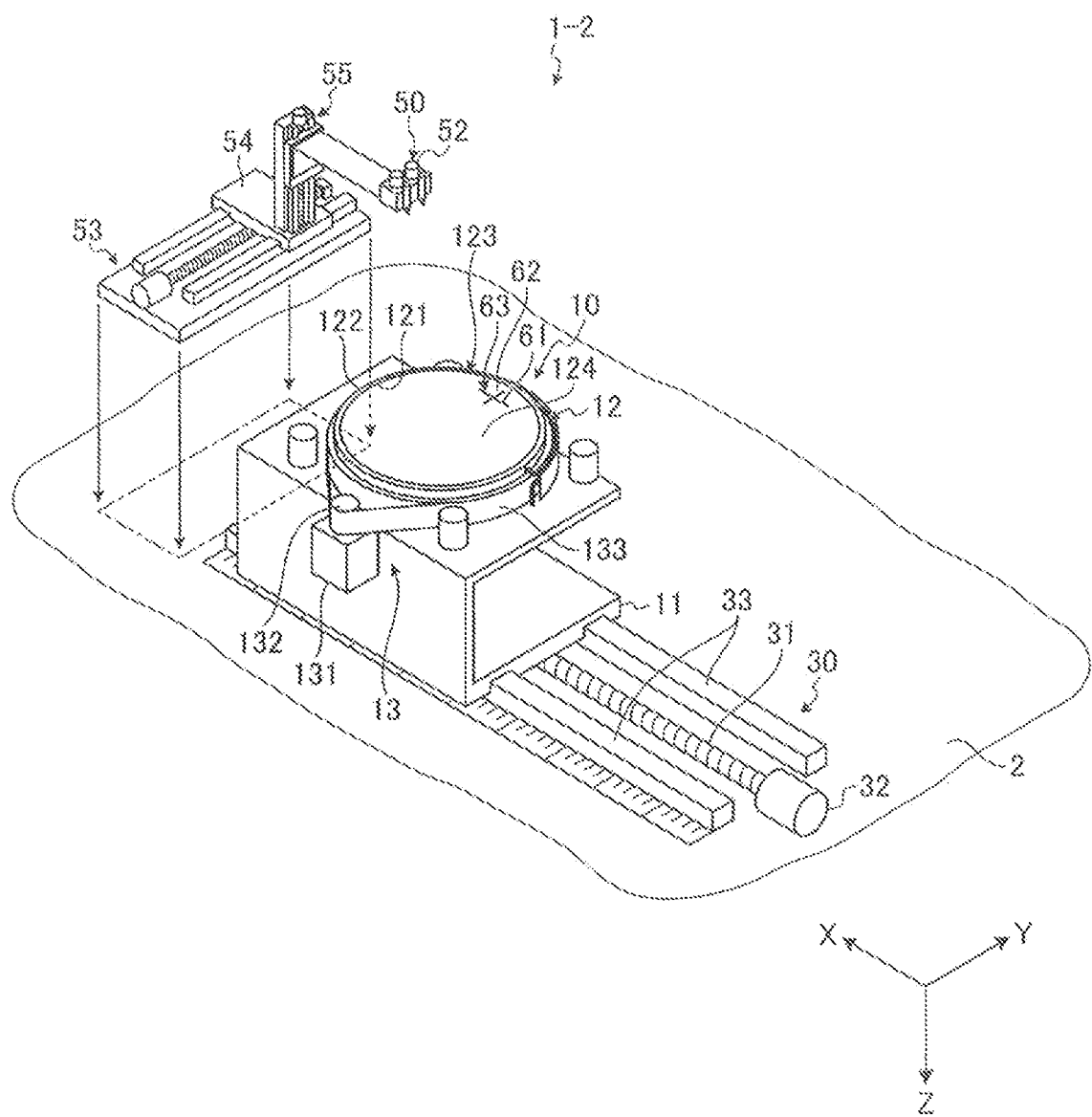
FIG. 19 is a perspective view depicting a holding unit and a second camera in the processing apparatus depicted in FIG. 18.

A processing apparatus according to a second embodiment of the present invention will be described based on the attached drawings, specifically FIGS. 18 to 20. Reference will first be made to FIGS. 18 and 19. FIG. 18 is a perspective view depicting a configuration of part of the processing apparatus according to the second embodiment. FIG. 19 is a perspective view depicting a holding unit and a second camera in the processing apparatus depicted in FIG. 18. In FIGS. 18 and 19, portions identical to those in the first embodiment are identified by the same numerals, and their description will be omitted herein.

A processing apparatus 1-2 according to the second embodiment is the same as the processing apparatus 1 of the first embodiment except that a linear mark 61 is formed in the holding surface 124 of the chuck table 12 and that, in a correction amount calculation operation, the correction amount calculation section 101 images the mark 61 by the first camera 51 and the second camera 52 and calculates correction values in the Y-axis direction, a positional deviation between the imaging area of the first camera 51 and the imaging area of the second camera 52, and a correction angle for the chuck table 12, and the coordinate storage section 103 stores a positional deviation between the first camera 51 and the second camera 52 as calculated by the correction amount calculation section 101.

In the second embodiment, as depicted in FIGS. 18 and 19, a second mark 62 that crosses the linear mark 61 at right angles and overlaps the mark 61 is formed in the holding surface 124 of the chuck table 12 in addition to the mark 61, so that a mark 63 composed of the marks 61 and 62 is formed.

In the correction amount calculation operation, the control unit 100 holds the workpiece 200 under suction on the holding surface 124 of the chuck table 12 of the holding unit 10 via the tape 211 without rotating the cutting blade 21 of the cutting unit 20, and positions the chuck table 12 in the processing zone 3 to make the mark 61 and the first camera 51 face each other in the Z-axis direction. In the correction amount calculation operation, the correction amount calculation section 101 images the linear mark 61 in the chuck table 12 by the first camera 51, and rotates the chuck table 12 to adjust a longitudinal direction of the mark 61 to a direction parallel to the X-axis direction.

In the correction amount calculation operation, the correction amount calculation section 101 causes the first camera 51 to image predetermined positions on opposite end portions of the mark 61 while moving the chuck table 12 along the X-axis direction from the processing zone 3 to the imaging zone 5, thereby acquiring a first image 301 (hereinafter designated by numeral 301-4) captured by imaging one end portion of the mark 61 with the first camera 51 and another first image 301 (hereinafter designated by numeral 301-5) captured by imaging an opposite end portion of the mark 61 with the first camera 51.

The coordinate calculation section 102 extracts the mark 61 from the first image 301-4 and calculates the X coordinate (X1) and the Y coordinate (Y1) of a center of the mark 61, and the coordinate storage section 103 stores the coordinates (X1, Y1) of the center of the mark 61 in the first image 301-4. The coordinate calculation section 102 extracts the mark 61 from the first image 301-5 and calculates the X coordinate (X2) and the Y coordinate (Y1) of the center of the mark 61, and the coordinate storage section 103 stores the coordinates (X2, Y1) of the center of the mark 61 in the first image 301-5. In this manner, the coordinate calculation section 102 calculates the coordinates (X1, Y1) of the center of the one end portion of the mark 61 and the coordinates (X2, Y1) of the center of the opposite end portion of the mark 61, both, in the processing zone 3, and stores the coordinates (X1, Y1) and the coordinates (X2, Y1) in the coordinate storage section 103.

After the chuck table 12 has approached the imaging zone 5, the correction amount calculation section 101 moves the chuck table 12 further in the imaging zone 5, and causes the second camera 52 to image the predetermined positions (the same positions as the imaging positions of the first camera 51) on both the end portions of the mark 61. The correction amount calculation section 101 acquires a second image 302 (hereinafter designated by numeral 302-4) captured by imaging the one end portion of the mark 61 with the second camera 52 and another second image 302 (hereinafter designated by numeral 302-5) captured by imaging the opposite end portion of the mark 61 with the second camera 52.

The coordinate calculation section 102 extracts the mark 61 from the second image 302-4 and calculates the X coordinate (X1) and Y coordinate (Y2) of the center of the mark 61, and the coordinate storage section 103 stores the coordinates (X1, Y2) of the center of the mark 61 in the second image 302-4. The coordinate calculation section 102 extracts the mark 61 from the second image 302-5 and calculates the X coordinate (X2) and Y coordinate (Y3) of the center of the mark 61, and the coordinate storage section 103 stores the coordinates (X2, Y3) of the center of the mark 61 in the second image 302-5. In this manner, the coordinate calculation section 102 calculates the coordinates (X1, Y2) of the center of the one end portion of the mark 61 and the coordinates (X2, Y3) of the center of the opposite end portion of the mark 61, both, in the imaging zone 5, and the coordinate storage section 103 stores the coordinates (X1, Y2) and the coordinates (X2, Y3).

From the above-mentioned coordinates (X1, Y1), (X2, Y1), (X1, Y2), and (X2, Y3), the correction amount calculation section 101 calculates an angle θ formed by the mark 61 extracted from the second image 302 and the mark 61 extracted from the first image 301 by the formula 1 as in the first embodiment, and stores the calculated angle θ as a correction value, i.e., a correction angle for the chuck table 12 in the coordinate storage section 103.

In addition, the correction amount calculation section 101 also calculates, from the above-mentioned coordinates (X1, Y1), (X2, Y1), (X1, Y2), and (X2, Y3), a difference of the Y coordinates for the respective X coordinates of the same position on the holding surface 124 in the processing zone 3 and the imaging zone 5 as in the first embodiment.

The correction amount calculation section 101 stores, as correction values in the Y-axis direction in the imaging zone 5, the difference (Y2−Y1) of the Y-coordinates, the difference (Y3−Y1) of the Y coordinates, and the difference of the Y coordinates at the respective positions between the coordinate (X1) and the coordinate (X2), which have been calculated as in the first embodiment, in the coordinate storage section 103.

As described above, the correction amount calculation section 101 calculates the correction values in the Y-axis direction and the correction angle for the chuck table 12, both, in the imaging zone 5 from the Y coordinates (Y1), (Y2), (Y3), etc. of the centers of both of the end portions of the single mark 61, the centers being two points that are apart from each other in the X-axis direction, and stores them in the coordinate storage section 103. In the second embodiment, the correction amount calculation section 101 calculates both the correction values in the Y-axis direction and the correction angle for the chuck table 12 and stores them in the coordinate storage section 103. In the present invention, however, it is sufficient to calculate and store at least either the correction values or the correction angle as in the first embodiment.

The coordinate storage section 103 positions the second camera 52 below both of the end portions of the mark 61, the end portions being the regions imaged by the first camera 51, and causes the second camera 52 to image the end portions, and stores the difference (Y2−Y1) of the Y coordinates at the coordinate (X1), the difference (Y3−Y1) of the Y coordinates at the coordinate (X2), and the difference of the Y coordinates at the respective positions between the coordinate (X1) and the coordinate (X2), the differences having been calculated by the correction amount calculation section 101, so that the positional deviation between the imaging area of the first camera 51 and the imaging area of the second camera 52 is stored as X coordinates and Y coordinates.

After the correction amount calculation section 101 has calculated the correction values in the Y-axis direction, the correction angle for the chuck table 12, and the positional deviation between the imaging area of the first camera 51 and the imaging area of the second camera 52, all, in the imaging zone 5, and the coordinate storage section 103 has stored them, the processing apparatus 1-2 according to the second embodiment operates as in the first embodiment.

The correction amount calculation section 101 calculates the correction values in the Y-axis direction, the correction angle for the chuck table 12, and the positional deviation between the imaging area of the first camera 51 and the imaging area of the second camera 52, all, in the imaging zone 5, the coordinate storage section 103 stores them, and then the processing apparatus 1-2 operates as in the first embodiment. Therefore, the above-described processing apparatus 1-2 according to the second embodiment, like the first embodiment, can bring about the advantageous effect that a reduction in processing accuracy can be suppressed while suppressing an increase in cost.

Figure 20:
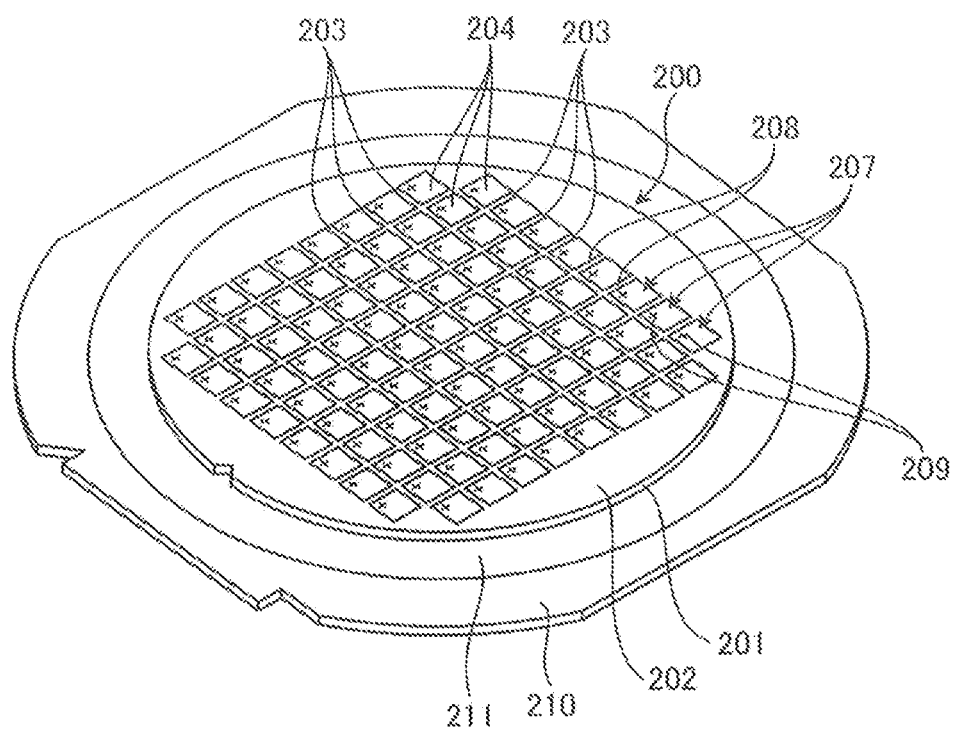
FIG. 20 is a perspective view depicting the workpiece of FIG. 2 with a tape bonded on a back surface thereof.

Reference will next be made to FIG. 20. FIG. 20 is a perspective view depicting the workpiece of FIG. 2 with the tape bonded on the back surface thereof. In FIG. 20, portions identical to those in the first embodiment are identified by the same numerals, and their description will be omitted herein.

If the tape 211 is bonded to the side of the back surface 205 of the workpiece 200 and the devices 204 are directed upward, as depicted in FIG. 20, in the second embodiment, the processing apparatus 1-2 may hold the workpiece 200 under suction on the holding surface 124 of the chuck table 12 via the tape 211. If this is the case, the first camera 51 and the second camera 52 may image, for example, both end portions of one of the marks 208 and 209 in a desired one of the key patterns 207, specifically the mark 208, the correction amount calculation section 101 may calculate the correction values in the Y-axis direction, the correction angle for the chuck table 12, and the positional deviation between the imaging area of the first camera 51 and the imaging area of the second camera 52, all, in the imaging zone 5, the coordinate storage section 103 may store them, and then the processing apparatus 1-2 may operate as in the first embodiment.

After imaging the cut groove 400, the mark 61, or the mark 208 by the first camera 51 and the second camera 52 and calculating the correction values in the Y-axis direction, the correction angle for the chuck table 12, and the positional deviation between the imaging area of the first camera 51 and the imaging area of the second camera 52, all, in the imaging zone 5, the present invention may rotate the chuck table 12 90 degrees about its axis, and may then confirm whether the cut groove 400, the mark 61, or the mark 208 extends along the Y-axis direction. Described specifically, the correction amount calculation section 101 images the cut groove 400, the mark 61, or the mark 208 by the first camera 51 and the second camera 52 and calculates the correction values in the Y-axis direction, the correction angle for the chuck table 12, and the positional deviation between the imaging area of the first camera 51 and the imaging area of the second camera 52, all, in the imaging zone 5, rotates the chuck table 12 90 degrees about its axis, and then confirms whether the cut groove 400, the mark 61, or the mark 208 extends along the Y-axis direction. In the case of the second embodiment, it is desired to confirm whether the mark 62 or 209 extends in the X-axis direction.

The present invention shall not be limited to the above-described embodiments. In other words, the present invention can be practiced with various modifications within the scope not departing from the spirit of the present invention. In the embodiments, the processing apparatuses 1 and 1-2 are cutting apparatuses that cut the workpieces 200 and 200-1. In the present invention, however, the processing apparatus is not limited to such a cutting apparatus, but may be, for example, a laser processing apparatus that irradiates a laser beam of a wavelength having absorption in or transmission through the workpieces 200 and 200-1. If the processing apparatus 1 or 1-2 is a laser processing apparatus, its laser beam irradiation unit that irradiates a laser beam corresponds to the processing unit, and a laser-processed groove or a modified layer formed in the workpiece 200 or 200-1 corresponds to a processed mark. In the present invention, the first camera 51 and second camera 52 may be infrared cameras.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A method of using a processing apparatus, wherein the processing apparatus includes a holding unit having a rotatable chuck table configured to hold a workpiece; a processing unit configured to process the workpiece held on the chuck table; a processing feed unit that carries out processing feed of the holding unit in an X-axis direction; an indexing feed unit that carries out indexing feed of the processing unit in a Y-axis direction; a camera that images the workpiece held on the chuck table and is movable in an indexing feed direction; and a control unit configured to control the holding unit, the processing unit, the processing feed unit, the indexing feed unit, and the camera, wherein the processing feed unit includes guide rails, and is configured to move the holding unit along the guide rails between a processing zone, in which the workpiece is processed by the processing unit, and an imaging zone, in which the workpiece is imaged by the camera at a position that is apart from the processing zone by a predetermined distance in the X-axis direction, and the control unit includes a correction amount calculation section that controls the holding unit, the processing unit, the processing feed unit, the indexing feed unit and the camera, the method comprising:

forming a linear processed mark in the workpiece using the processing unit while carrying out processing feed of the chuck table;

after forming the linear processed mark in the workpiece, moving the chuck table to the imaging zone;

imaging the processed mark using the camera while the chuck table is in the imaging zone;

calculating correction values in the Y-axis direction or a correction angle for the chuck table from Y-coordinates of two points that are apart from each other in a processing feed direction on the processed mark; and carrying out processing feed of the chuck table in the imaging zone under a condition in which the camera has been corrected in position in the Y-axis direction based on the correction values or the chuck table has been rotated by the correction angle.

2. The method according to claim 1, wherein the chuck table has a transparent member that forms a holding surface configured to hold the workpiece thereon, the camera has, at positions which are up and down with the transparent member interposed therebetween, a first camera in a vicinity of the processing unit and a second camera that is more distant than the first camera from the processing unit, and the control unit further includes a coordinate storage section, the method further comprising:

storing, in the coordinate storage section of the control unit, in terms of X and Y-coordinates, a positional deviation between the first camera positioned to image a predetermined region on the workpiece held on the chuck table and the second camera positioned to image the predetermined region; and correcting the position of the second camera based on the X and Y-coordinates stored in the coordinate storage section such that the second camera can image the predetermined region imaged by the first camera.

3. The method according to claim 2, further comprising:

capturing a first image by the first camera;

capturing a second image by the second camera;

displaying the first image and the second image on a display unit; and sending, via an image control section of the control unit, signals to display the first image and the second image in superposition or juxtaposition on the display unit with one of the first image and the second image being inverted in the processing feed direction.

4. A method of using a processing apparatus wherein the processing apparatus includes a holding unit having a rotatable chuck table configured to hold a workpiece; a processing unit configured to process the workpiece held on the chuck table; a processing feed unit that carries out processing feed of the holding unit in an X-axis direction; an indexing feed unit that carries out indexing feed of the processing unit in a Y-axis direction; a camera that images the workpiece held on the chuck table and is movable in the Y-axis direction; and a control unit configured to control the holding unit, the processing unit, the processing feed unit, the indexing feed unit, and the camera, wherein the processing feed unit includes guide rails, and is configured to move the holding unit along the guide rails between a processing zone, in which the workpiece is processed by the processing unit, and an imaging zone, in which the workpiece is imaged by the camera at a position that is apart from the processing zone by a predetermined distance, the camera has a first camera in a vicinity of the processing unit, and a second camera that is more distant than the first camera from the processing unit, and the control unit includes a correction amount calculation section that controls the holding unit, the processing feed unit, the indexing feed unit and the camera to perform a method comprising:

imaging a linear mark in the workpiece or the chuck table by the first camera;

rotating the chuck table to adjust the mark to a direction parallel to the X-axis direction;

moving the chuck table to the imaging zone to image the mark by the second camera;

calculating correction values in the Y-axis direction or a correction angle for the chuck table from X and Y-coordinates of two points that are apart from each other in the X-axis direction on the mark; and carrying out processing feed of the chuck table in the imaging zone and carrying out imaging with the second camera in which the second camera is subjected to indexing feed based on the correction values or the chuck table is rotated by the correction angle.

5. The method according to claim 4, wherein the chuck table has a transparent member that forms a holding surface configured to hold the workpiece thereon, the camera has the first camera and the second camera at positions which are up and down with the transparent member interposed therebetween, and the control unit further includes a coordinate storage section, the method further comprising:

storing, in the coordinate storage section of the control unit, in terms of X and Y-coordinates, a positional deviation between the first camera positioned to image a predetermined region on the workpiece held on the chuck table and the second camera positioned to image the predetermined region, and correcting the position of the second camera based on the X and Y-coordinates stored in the coordinate storage section such that the second camera can image the predetermined region imaged by the first camera.

6. The method according to claim 5, further comprising:

capturing a first image by the first camera;

capturing a second image by the second camera;

displaying the first image and the second image on a display unit; and sending, via an image control section of the control unit, signals to display the first image and the second image in superposition or juxtaposition on the display unit with one of the first image and the second image being inverted in the X-axis direction.

* * * * *